(12) United States Patent
Shimada et al.

(10) Patent No.: US 6,390,831 B2
(45) Date of Patent: May 21, 2002

(54) SHELF-TYPE TELECOMMUNICATIONS DEVICE INCLUDING MAIN AND SUB BACK WIRED BOARDS CONNECTED BY RELAY CONNECTORS

(75) Inventors: Shozo Shimada; Hirofumi Imabayashi; Mitsuo Kaetsu; Noboru Nakama; Takashi Sekiguchi, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/347,219

(22) Filed: Jul. 2, 1999

(30) Foreign Application Priority Data

Oct. 26, 1998 (JP) .............................. 10-304394

(51) Int. Cl.$^7$ ............................................... H01R 12/00
(52) U.S. Cl. ..................... 439/78; 439/76.1; 439/908; 439/74
(58) Field of Search ........................... 439/78, 908, 74, 439/75, 76.1

(56) References Cited

U.S. PATENT DOCUMENTS

| 4,883,429 | A | * | 11/1989 | Suzuki et al. | ................. 439/74 |
| 5,181,855 | A | * | 1/1993 | Mosquera et al. | ............ 439/74 |
| 5,522,730 | A | * | 6/1996 | Soes et al. | .................... 439/78 |

* cited by examiner

Primary Examiner—Tho D. Ta
Assistant Examiner—Truc Nguyen
(74) Attorney, Agent, or Firm—Rosenman & Colin LLP

(57) ABSTRACT

A shelf-type telecommunications device has a back wired board assembly mounted on a back of a shelf unit into which a plurality of plug-in units are inserted side by side. The back wired board assembly has a main back wired board to which at least one plug-in unit is connected and a sub back wired board to which at least one external cable is connected, the outer surface of the main back wired board and the inner surface of the sub back wired board opposing each other. The main back wired board and the sub back wired board are fitted together by using a plurality of relay connectors or pin terminals so as to electrically connect the main back wired board and the sub back wired board to each other without the need for coaxial cables, thus reducing the size of the device.

7 Claims, 31 Drawing Sheets

71: TRANSPORT COMPLEX
72: SERVICE COMPLEX
73: SWITCHING COMPLEX
74: SYNCHRONIZATION COMPLEX
75: MANAGEMENT COMPLEX

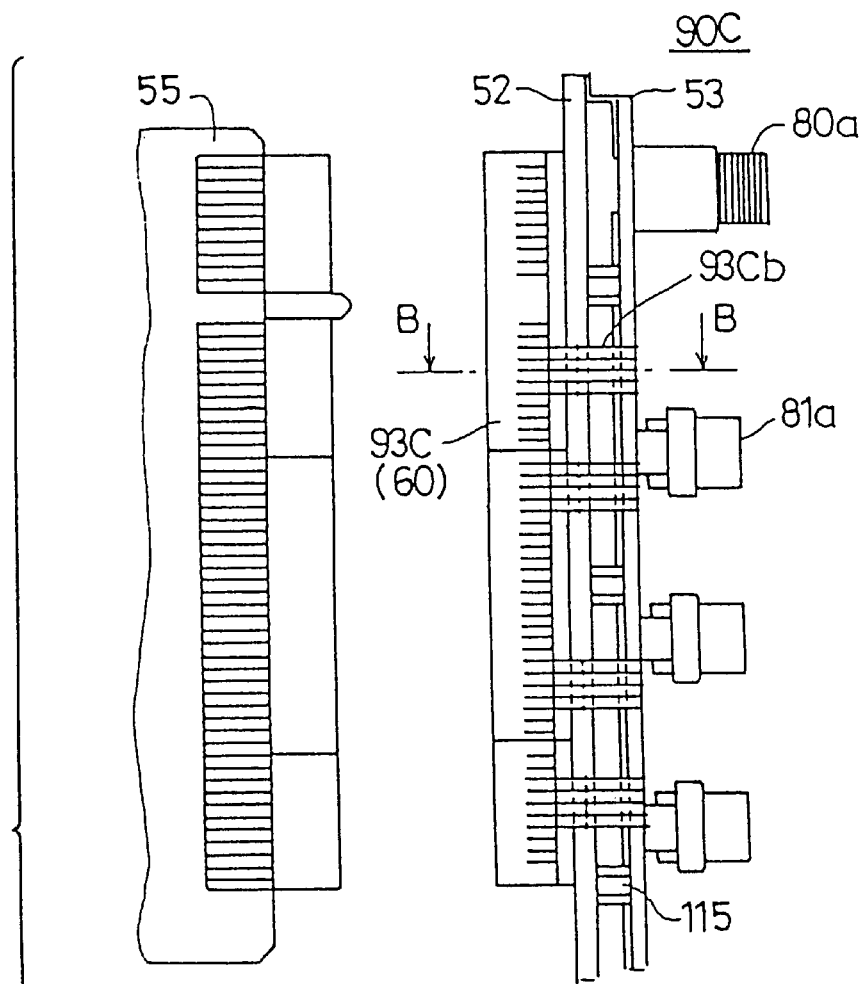
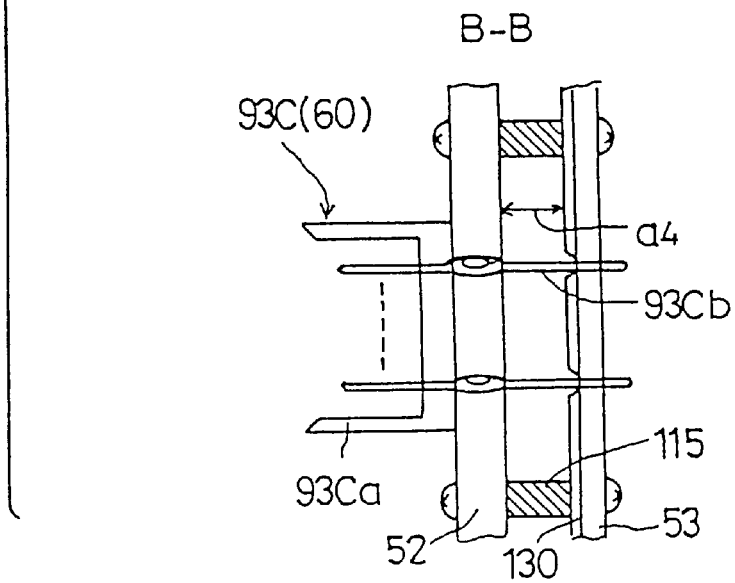
FIG. 25

FIG. 30
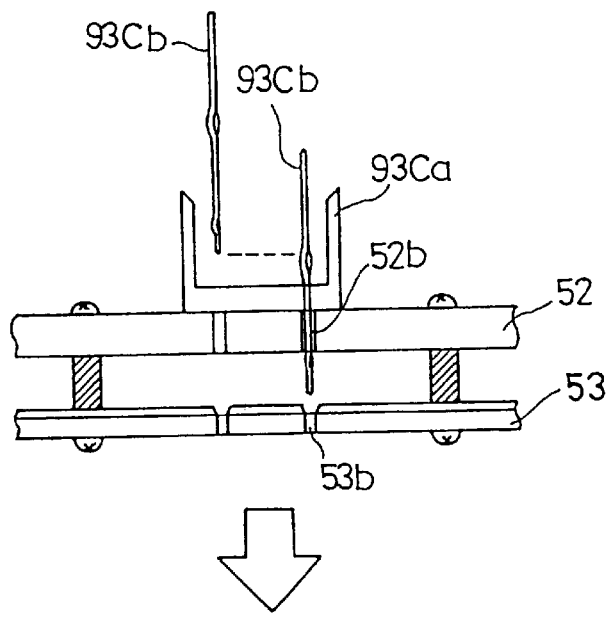
(A)
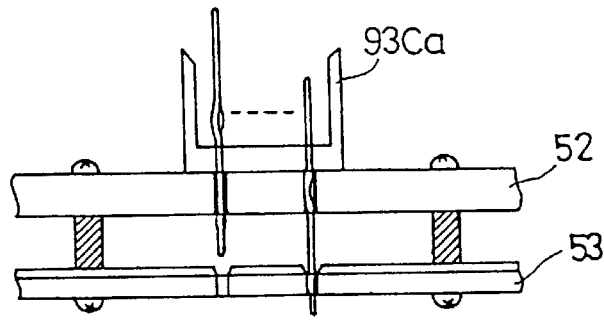
(B)
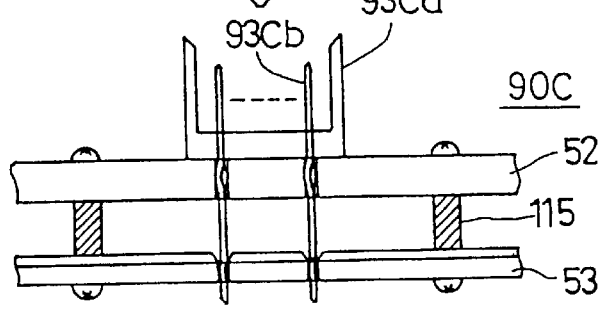
(C)

SHELF-TYPE TELECOMMUNICATIONS DEVICE INCLUDING MAIN AND SUB BACK WIRED BOARDS CONNECTED BY RELAY CONNECTORS

BACKGROUND OF THE INVENTION

1. Field of the Invention

The present invention relates to a shelf-type telecommunications device.

2. Description of the Related Art

At present, a shelf-type SONET MUX is widely used as one type of telecommunications device on trunk lines in telephone networks in North America. As demand for telecommunications services has increased in recent years telecommunications devices for integrating a variety of different functions added to the SONET MUX, including data interfaces, ATM switches, etc., have come to be developed.

At the same time, however, the: integration of different functions tends to lead to an increase in the overall size of the telecommunications device. As the amount of space in which to place telecommunications devices tends to be limited, smallness of size is an important factor in such devices.

FIG. 1 is a schematic structural diagram of a conventional telecommunications device 10. The telecommunications device 10 has a shelf structures. To the back of the shelf unit 11 are fixedly mounted a main back wired board 12 and a sub back wired board 13. Additionally, a back cover 14 is attached. Within the shelf unit 11 a plug-in unit 15 is inserted and installed. An external cable 21 is connected to the back of the telecommunications device 10.

The separation of the back wired board into a main back wired board 12 and a sub back wired board 13 exists because the electrical connection between the plug-in unit 15 and the external cable 21 is separated into the electrical connection of the plug-in unit 15 and the electrical connection of the external cable 21. That is, the function of electrically connecting the plug-in unit is assumed by the main back wired board 12 and the function of electrically connecting the external cable 21 is assumed by the sub back wired board 13.

As shown in FIG. 2, the plug-in unit 15 is connected to the plug-in unit connector 16 on the front of the main back wired board 12. The external cable 21 is connected to connector 17 on the sub back wired board 13 via an opening 14a in the back cover 14.

It should be noted that an electrical connection between the main back wired board 12 and the sub back wired board 13 is effected by a coaxial cable 18. However, effecting the electrical connection between the main back wired board 12 and the sub back wired board 13 by using a coaxial cable requires space for connecting the ends of each and every coaxial cable 18.

FIG. 3 shows rear and side rear views of a conventional telecommunications device 10 for integrating a variety of different functions. In keeping with the conventional art, the electrical connection between the main back wired board 12A and the sub back wired board 13A is effected by a coaxial cable 18A. By the integration of different functions the number of coaxial cables approaches 1,000, with corresponding space required for connecting the ends of each of the coaxial cables. As a result, the height Hi of the device 10 increases substantially to approximately 16U, 1 "U" being a standardized unit for measuring shelf height and equal to approximately 1.75 inches.

Additionally, as the number of these coaxial cables increases the size of the space 20 required for bending and accommodating the coaxial cables 18A also increases and accordingly, the spacing al between the sub back wired board 13A and the main back wired board 12A must be enlarged to approximately 30 mm. As a result, the depth of the device 10A also increases to a size A1.

SUMMARY OF THE INVENTION

Accordingly, it is a general object of the present invention to provide a shelf-type telecommunications device in which the problems described above are solved.

The above-described object of the present invention is achieved by providing a telecommunications device, comprising:

a shelf unit;

a plurality of plug-in units inserted into the shelf unit and disposed side by side;

a main back wired board fixedly mounted to a back of the shelf unit;

a sub back wired board positioned further to the rear of the main back wired board;

a plurality of connectors for plug-in units mounted on an inner surface of the main back wired board so as to be connected to the plug-in units inserted into the shelf unit;

a plurality of connectors for external cables mounted on an outer side of the sub back wired board so as to be connected to external cables;

a plurality of relay connectors mounted on a surface of the main back wired board, the surface opposing the sub back wired board, and electrically connected to the plurality of connectors for plug-in units; and a plurality of relay connectors mounted on surface of the sub back wired board, the surface opposing the main back wired board, the plurality of relay connectors being electrically connected to the plurality of connectors for external cables, wherein the plurality of relay connectors on the main back wired board and the corresponding plurality of relay connectors on the sub back wired board are fitted together, and the main back wired board and the sub back wired board are electrically connected to each other.

By providing a telecommunications device in which relay connectors between an opposed main back wired board and sub back wired board are connected, and thus electrically connecting the main back wired board and the sub back wired board, the need for space within which to connect the terminals of the conventional coaxial cable between the main back wired board and the sub back wired board is eliminated. By eliminating the need for such additional space there is little need for the main back wired board and the sub back wired board to increase in size even with an increase in device functions.

Further, the above-described object of the present invention is achieved by providing a telecommunications device comprising:

a shelf unit;

a plurality of plug-in units inserted into the shelf unit and disposed side by side;

a main back wired board fixedly mounted on a back of the shelf unit;

a sub back wired board positioned further to the rear of the main back wired board;

a plurality of plug-in unit connectors mounted on an inner surface of the main back wired board so as to be connected to the plug-in units inserted into the shelf unit;

a plurality of external cable connectors mounted on an outer surface of the sub back wired board so as to be connected to external cables; and a plurality of pin terminals provided on the plurality of plug-in unit connectors, the pin terminals each having two press-fit portions, wherein the pin terminals are pressed into and projected through the main back wired board toward the sub back wired board, and tip portions of the pin terminals are pressed into the sub back wire board, and the main back wired board and the sub back wired board are electrically connected to each other.

By providing a telecommunications device in which the electrical connection between the main back wired board and the sub back wired board is effected by plug-in unit connector pin terminals, it is possible to reduce the space between the opposed main back wired board and sub back wired board by approximately one third as opposed to an electrical connection effected by connecting relay connectors between the main back wired board and the sub back wired board.

Additionally, the above-described object of the present invention is also achieved by providing a telecommunications device comprising:

a shelf unit;

a plurality of plug-in units inserted into the shelf unit and disposed side by side;

a main back wired board fixedly mounted to a back of the shelf unit;

a sub back wired board positioned further to the rear of the main back wired board;

a plurality of connectors for plug-in units mounted on an inner surface of the main back wired board so as to be connected to the plug-in units inserted into the shelf unit;

a plurality of connectors for external cables mounted on an outer side of the sub back wired board so as to be connected to external cables;

a plurality of pin terminals provided on the plurality of plug-in unit connectors, tip portions of the pin terminals being inserted into and projected through the main back wired board; and a plurality of relay connectors mounted on a surface of the sub back wired board, the surface opposing the main back wired board, the plurality of relay connectors being electrically connected to the plurality of connectors for external cables, wherein tip portions of the plurality of plug-in unit connector pin terminals are connected to the plurality of relay connectors on the sub back wired board, and the main back wired board and the sub back wired board are electrically connected to each other.

By providing a telecommunications device in which the electrical connection between the main back wired board and the sub back wired board is effected by the plug-in unit connector pin terminals and the sub back wired board relay connectors, the need for relay connectors on the main back wired board is eliminated.

Other objects, features and advantages of the present invention will become more apparent from the following detailed description when read in conjunction with the accompanying drawings.

BRIEF DESCRIPTION OF THE DRAWINGS

FIG. 25 is a diagram of a fourth example of the back wired board assembly, including an expanded cross-sectional view thereof;

FIG. 30 is a diagram showing a method of assembling the back wired board assembly depicted in FIG. 25;

DESCRIPTION OF THE PREFERRED EMBODIMENTS

A detailed description will now be given of an embodiment of the present invention, with reference, initially, to FIG. 4 through FIG. 10.

Figure 1:
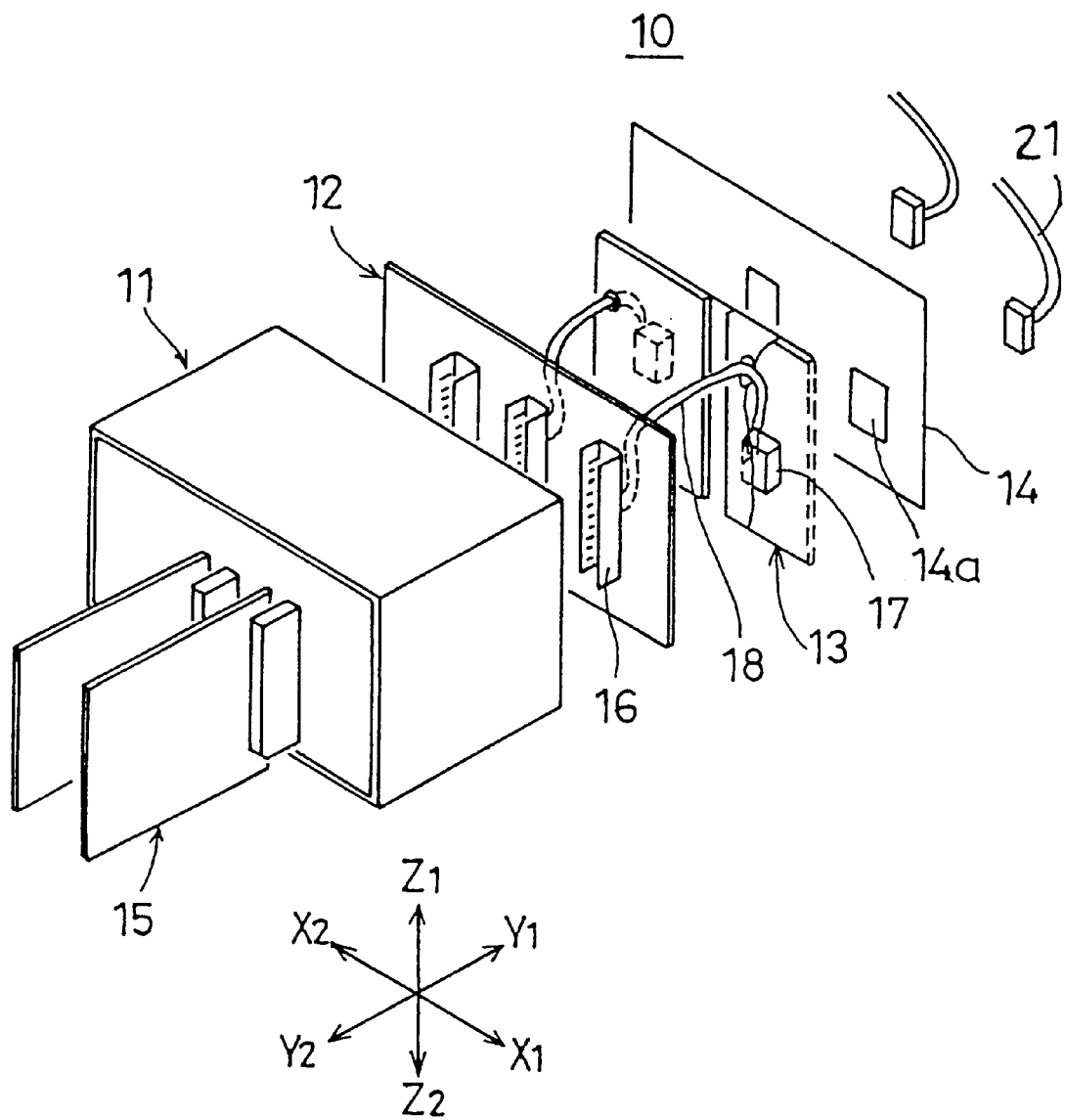
FIG. 1 is a schematic structural diagram of a conventional telecommunications device.
Figure 2:
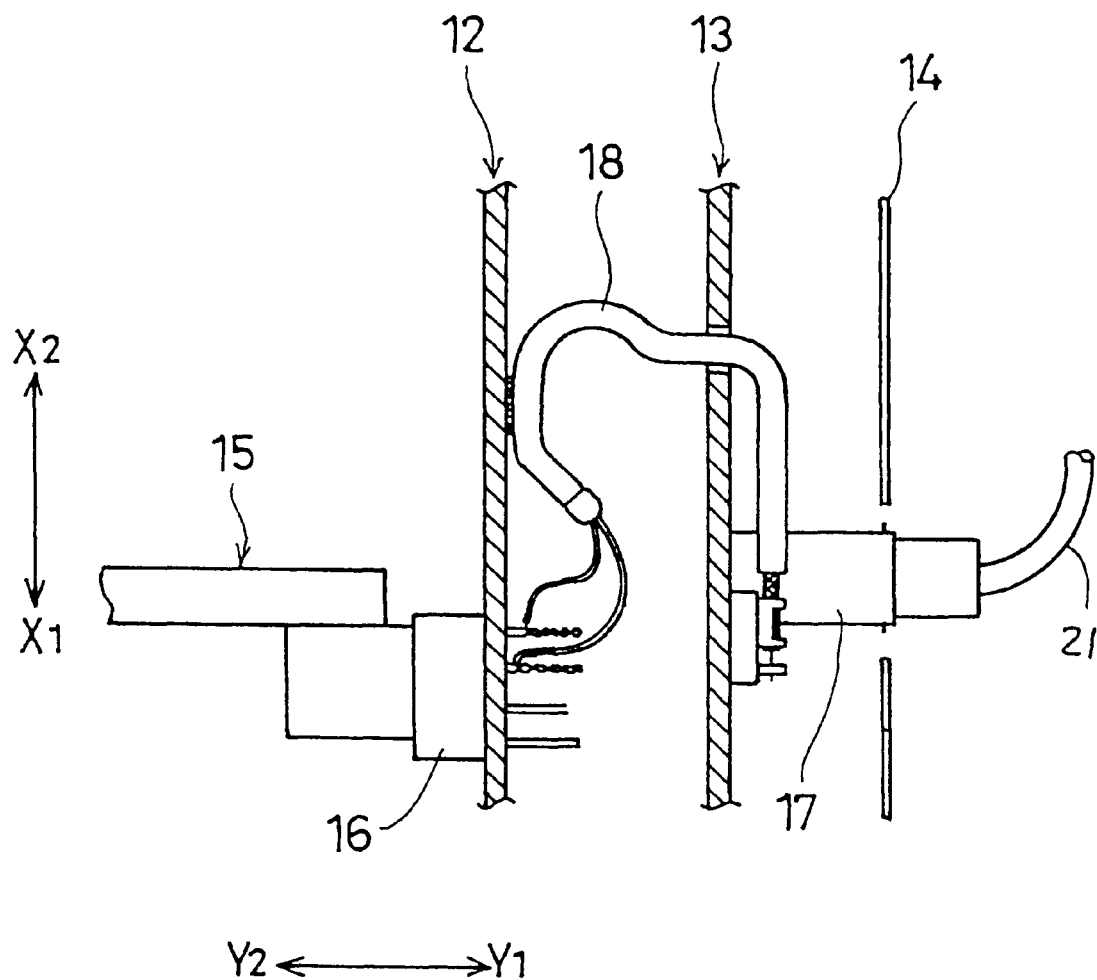
FIG. 2 is a planar view of a portion of the telecommunications device depicted in FIG. 1.
Figure 3:
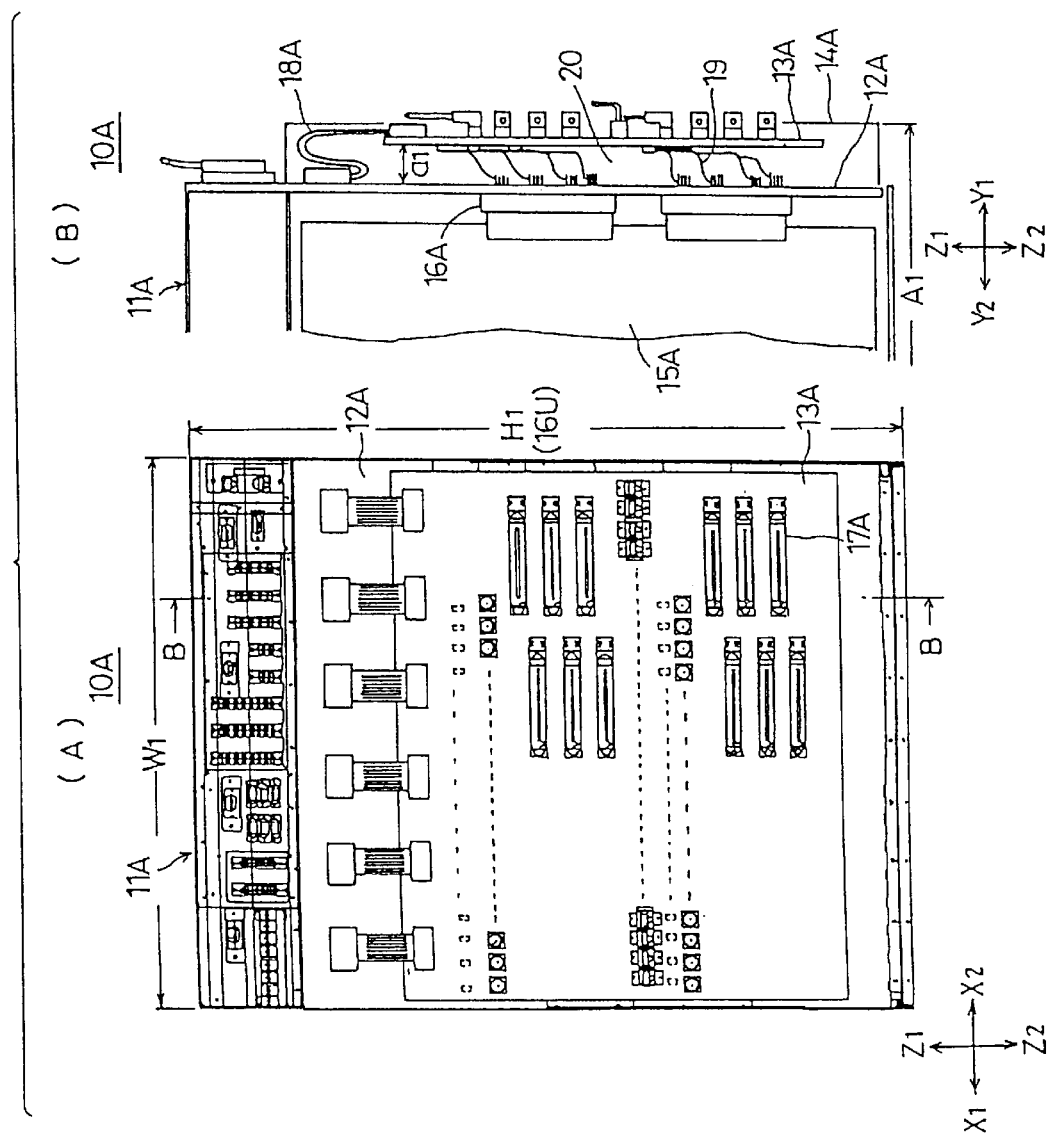
FIG. 3 shows rear and side rear views of a conventional telecommunications device for integrating a variety of different functions.
Figure 4:
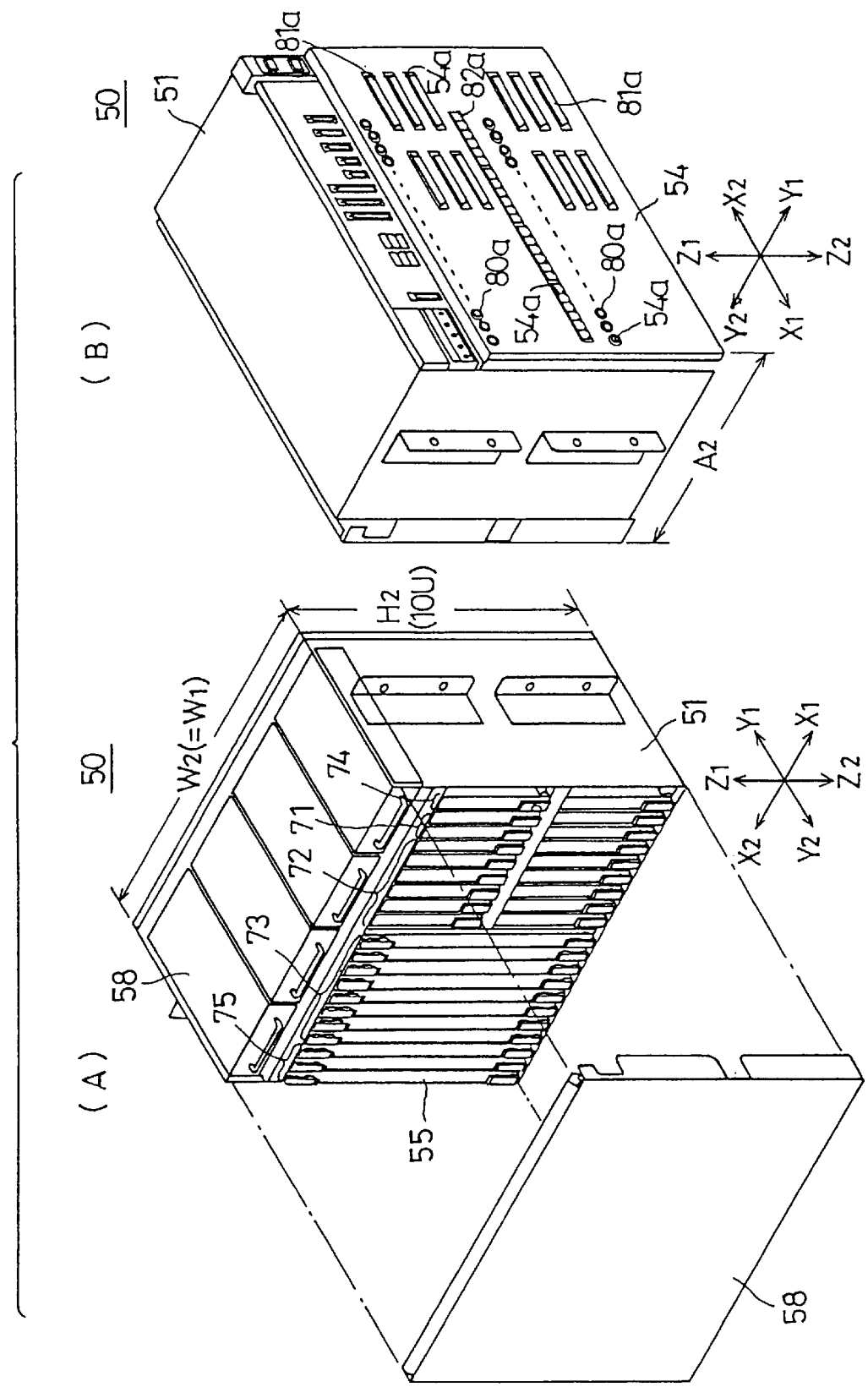
FIG. 4 is a diagram of a first embodiment of a telecommunications device for integrating different functions according to the present invention.
Figure 5:
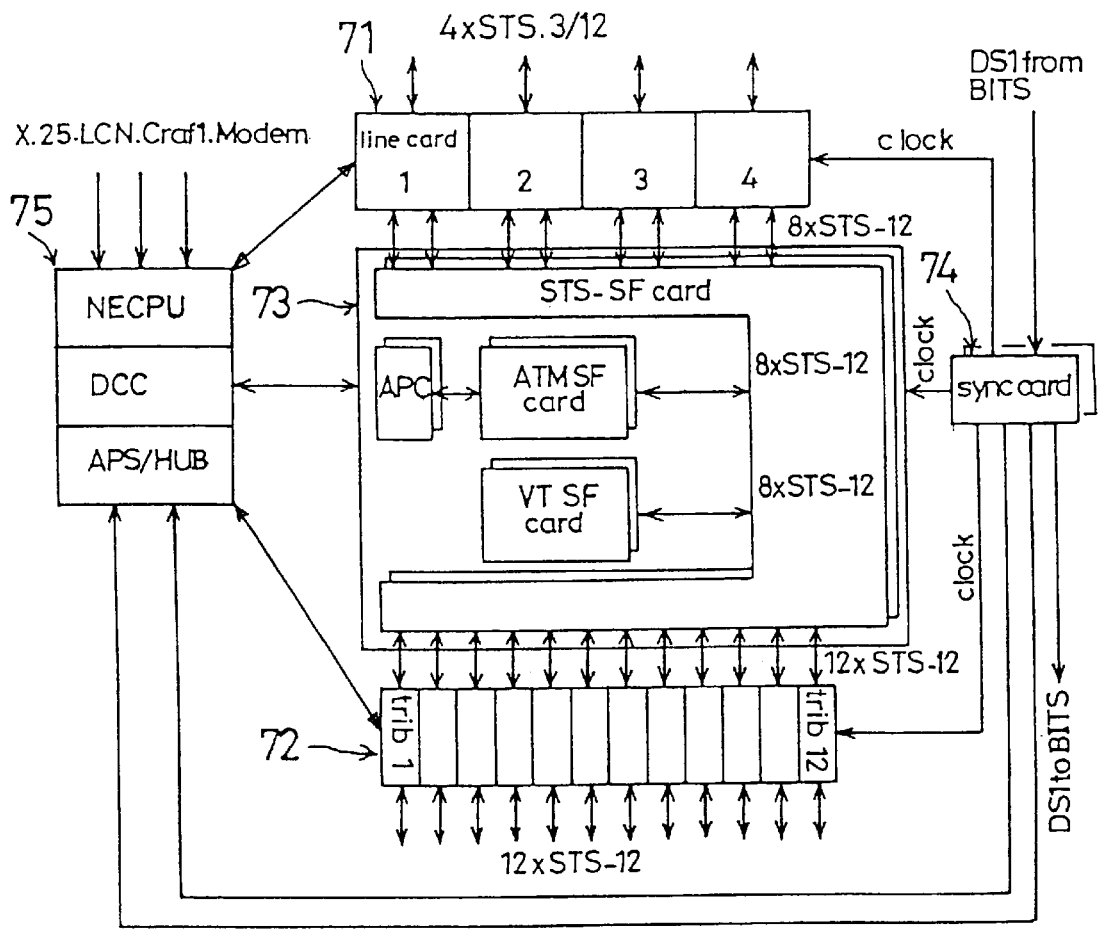
FIG. 5 is a block diagram of the telecommunications device depicted in FIG. 4.
Figure 6:
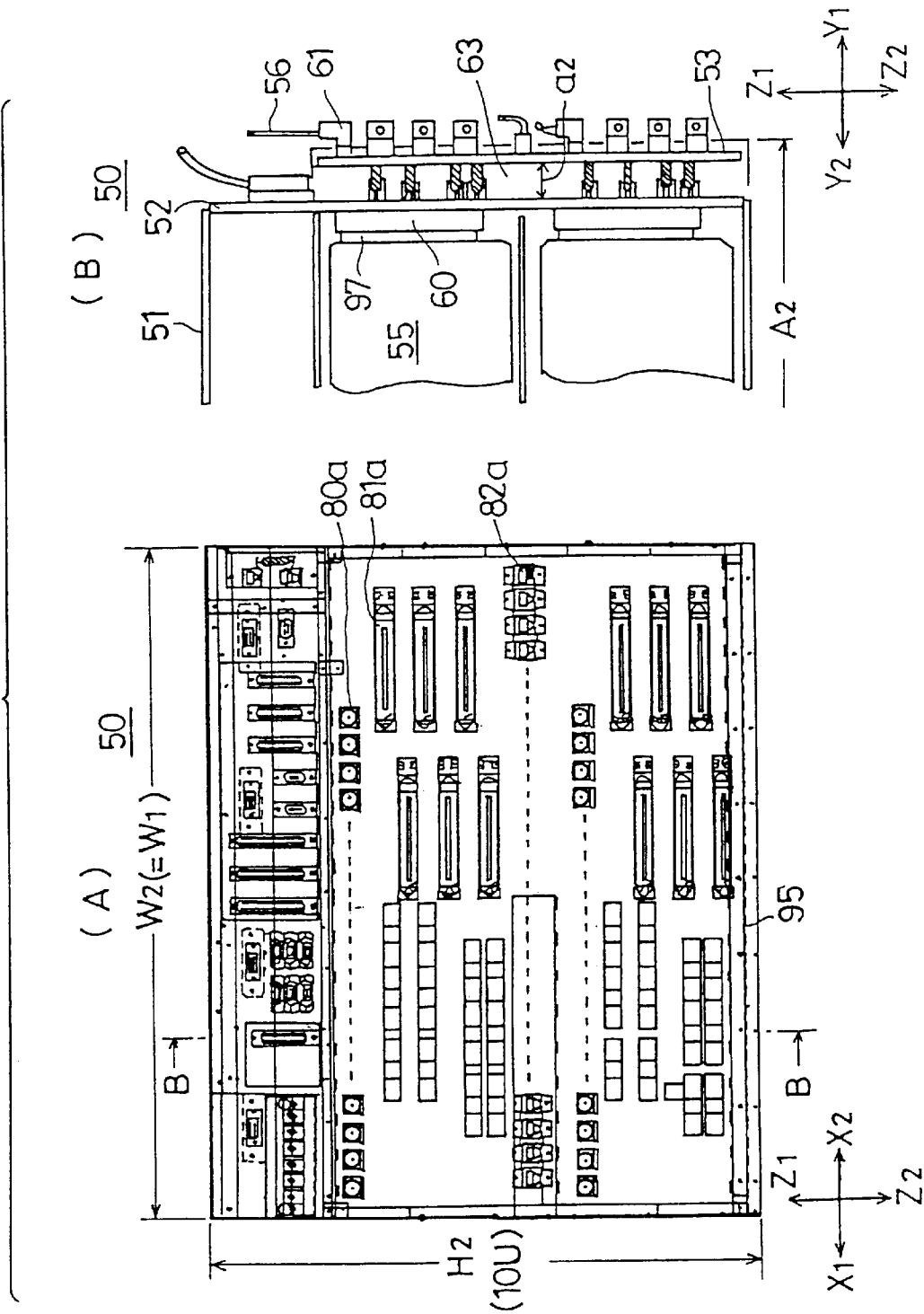
FIG. 6 is a diagram of the telecommunications device depicted in FIG. 4.
Figure 7:
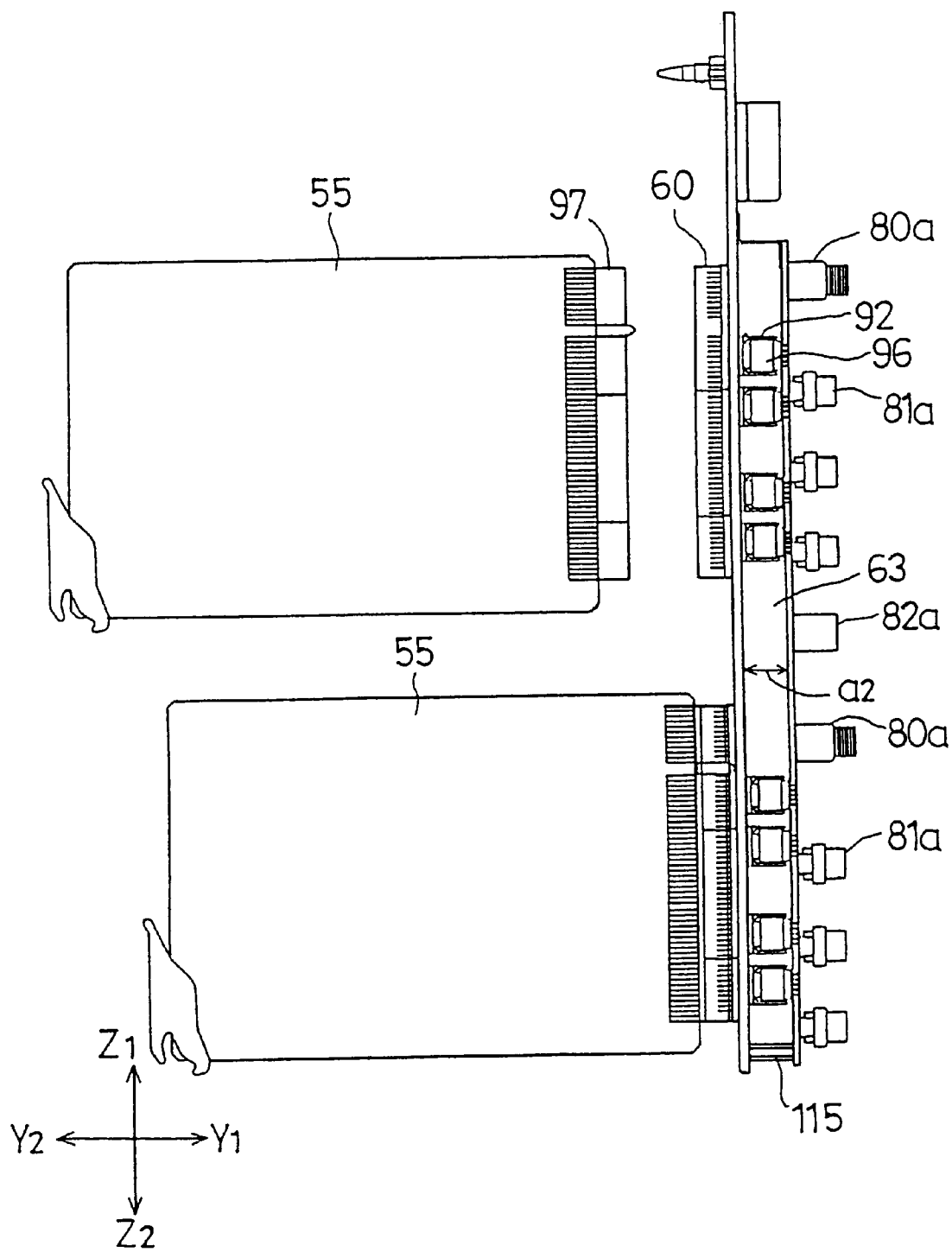
FIG. 7 is a detailed diagram of the side view of the telecommunications device depicted in FIG. 6.

FIG. 4 through FIG. 10 are diagrams of a first embodiment of a telecommunications device 50 integrating different functions according to the present invention. The telecommunications device 50 is one in which such functions as a data interface, ATM switch, etc., have been added to the SONET MUX and, as shown in FIG. 5, comprises a circuit configuration comprising transport complex 71, service complex 72, switching complex 73, synchronization complex 74 and management complex 75.

The transport complex 71 has a LINE terminal function The service complex 72 has a TRIB terminal function. The switching complex 73 has a traffic connection function between LINE and TRIB in the STS/VT/ATM cell unit. The management complex 75 has a surveillance and quality control/performance evaluation function.

Figure 9:
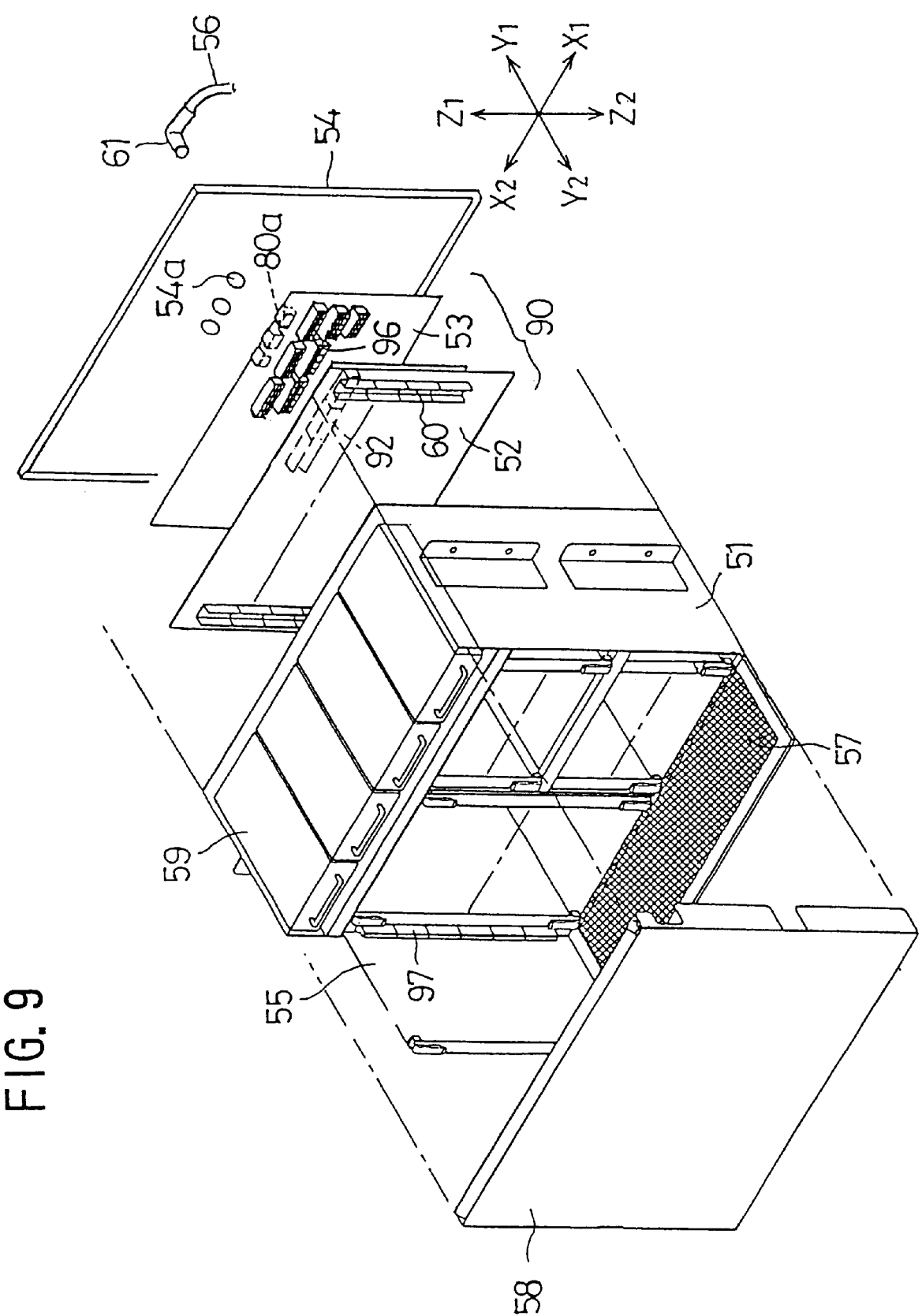
FIG. 9 shows an exploded view of the telecommunications device in FIG. 4.

The telecommunications device 50 is one that has structured this circuit configuration and, as shown in FIG. 4 and FIG. 9, is of a shelf-type construction. On the back surface of the shelf unit 51 a main back wired board 52 and a sub back wired board 53 are fixedly mounted and, further, a back cover 54 is attached. Inside the shelf a plurality of plug-in units 55 are inserted from the front of the shelf unit toward the rear of the shelf unit, and attached at the rear to client interface external cable 56. An air filter 57 is provided at the front side of the shelf unit 51 so as to cover the plug-in unit 55. Additionally, a front cover 58 is provided. A plurality of fan units 59 are mounted on the top surface of the shelf unit 51.

For reference purposes, the X axis represents width, the Y axis represents depth and the Z axis represents height.

A plurality of plug-in units 55 are connected to the plug-in unit connectors 60 on the front of the main back wired board 52 and are arranged side by side horizontally and, as shown in FIG. 4, form complexes 71–75.

The back wired board is divided into a main back wired board 52 and a sub back wired board 53. The main back wired board 52 serves the function of providing a place to which the plug-in unit 55 is electrically connected. The sub-back wired board 53 serves the function of providing a place to which the client interface external cable 56 is connected.

Figure 10:
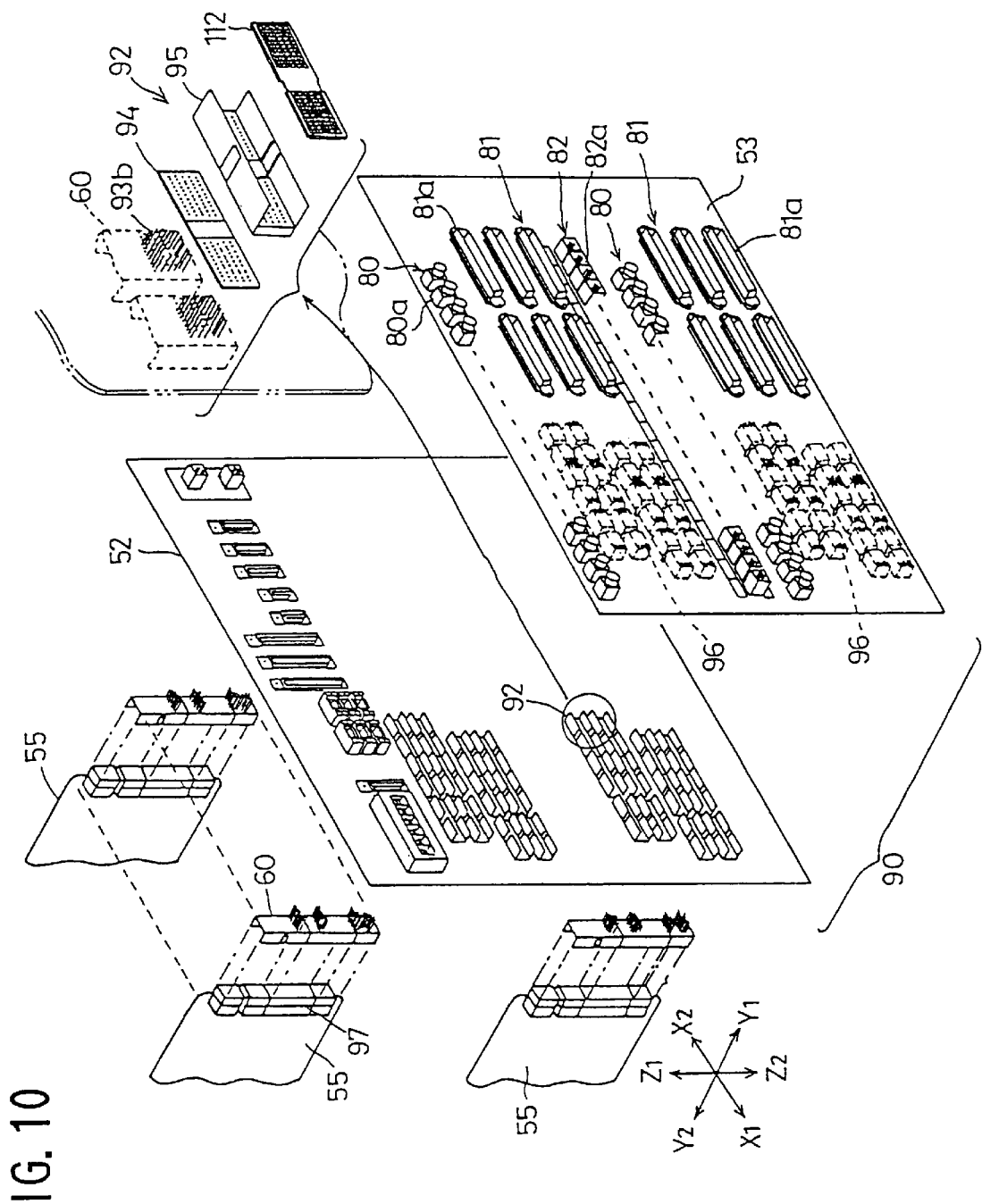
FIG. 10 is an exploded rear view of the telecommunications device depicted in FIG. 4.

As shown in FIG. 10, on the sub back wired board 53 are mounted a DS3 interface connector group 80, a DS1 interface connector group 81 and a LAN interface connector group 82. The DS3 interface connector group 80 comprises a group of connectors 80a including an upper section of 18 connectors and a central section of 18 connectors arranged at an even pitch along the horizontal X axis. The DS1 interface connector group 81 comprises a group of connectors 81a including 6 upper connectors and 6 lower connectors arranged horizontally. The LAN interface connector group 82 consists of a group of connectors 82a including 24 centrally positioned connectors arranged at an even pitch along the horizontal X axis.

As is explained more fully below, the main back wired board 52 and the sub back wired board 53 are connected by relay connectors without the use of cables. Accordingly, the main back wired board 52 and the sub back wired board 53 are connected by relay connectors and thus form the back wired board assembly 90. According to this construction, space on the main back wired board 52 and sub back wired board 53 for connecting the cables is no longer necessary. Accordingly, although the addition of functions such as data interfaces, ATM switches, etc., to the SONET MUX increases the number of electrical connections between the main back wired board 52 and the sub back wired board 53 by 1,000 or more, nevertheless the size of the main back wired board 52 and the sub back wired board 91 does not substantially increase.

Figure 8:
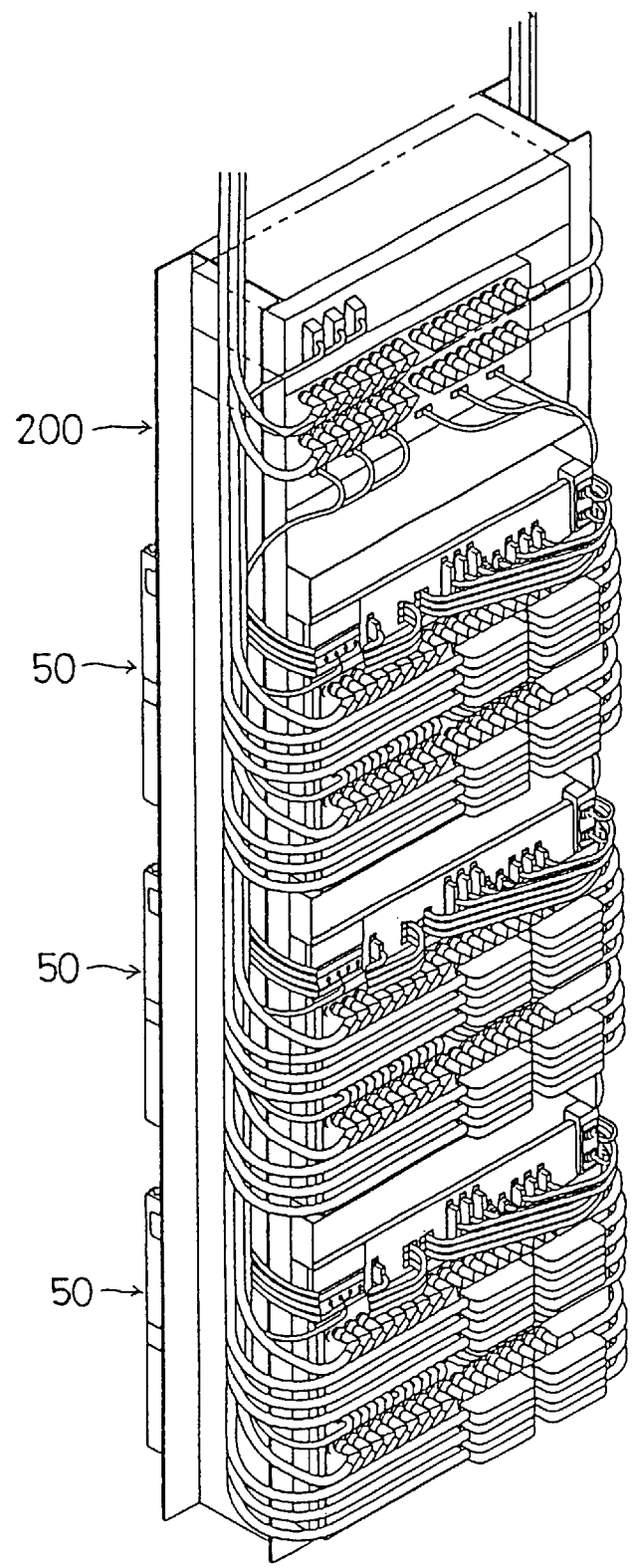
FIG. 8 shows a rear side view of the telecommunications device depicted in FIG. 4 in a state of installation in a rack.

Accordingly, the telecommunications device 50 of the present embodiment requires a height of no more than 10 U, a full 6 U shorter than the height of the main back wired board and sub back wired board when connected by cables according to the conventional art. Accordingly, such a reduction in the height of the telecommunications device 50, as shown in FIG. 8, makes it possible to install three such devices in the 7-foot rack that is standard in North America.

The width W2 of the telecommunications device 50 corresponds to the width of the rack, that is, W2=W1.

Additionally, because the main back wired board 52 and the sub back wired board 53 are connected by relay connectors without the use of cables, the width a2 of the space 63 between the sub back wired board 53 and the main back wired board 52 can be reduced by nearly half, from the conventional 30 mm to 17 mm. Accordingly, the telecommunications device 50 can be made more compact and, as a result, a passageway for an operator between devices positioned so that the backs of the devices face each other may be widened.

A description will now be given of a back wired board assembly 90, to be preceded, however, by a description of the main back wired board 52.

Figure 11:
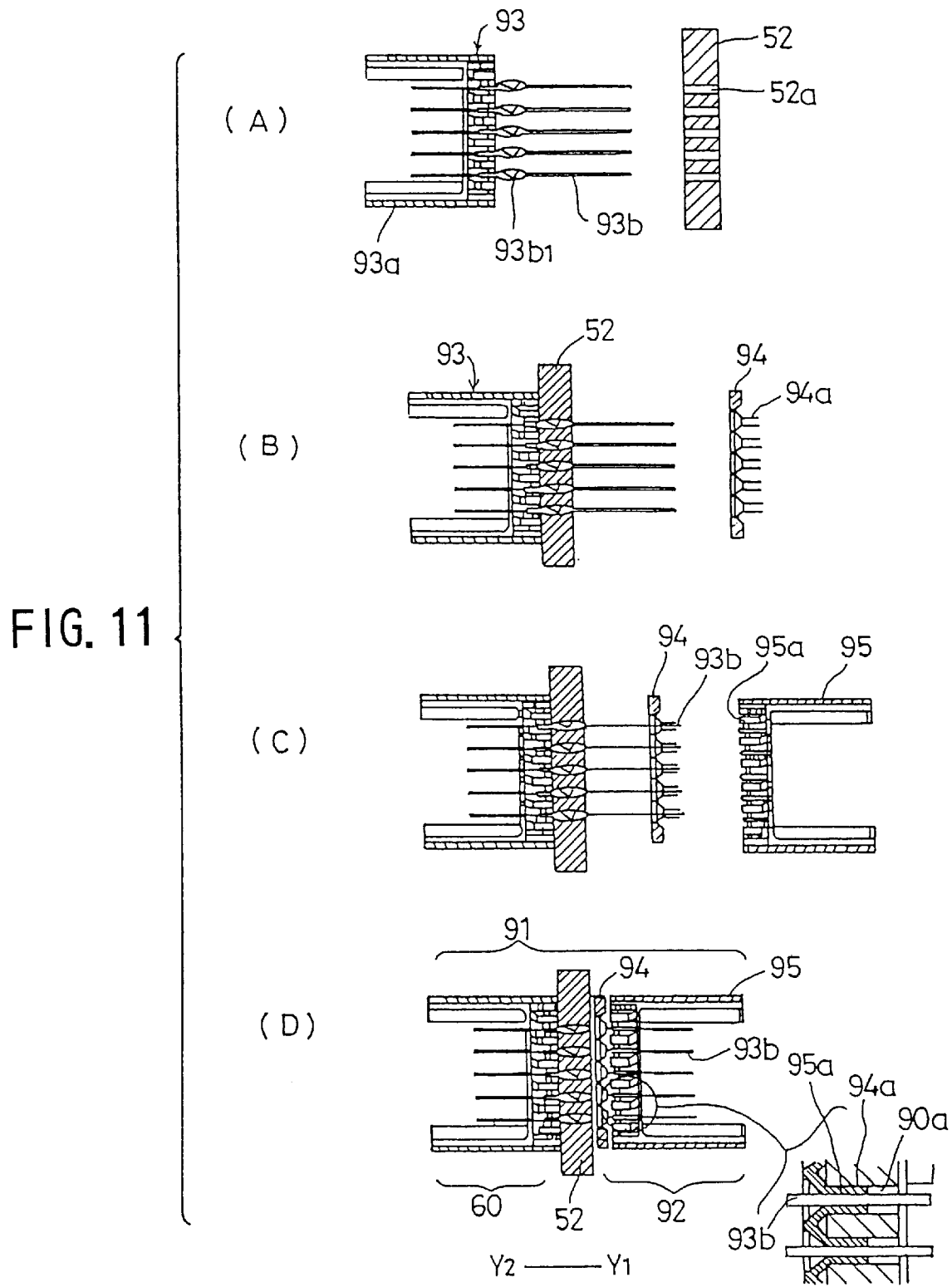
FIG. 11 is a diagram depicting the fixed mounting of a relay connector of the main back wired board.
Figure 14:
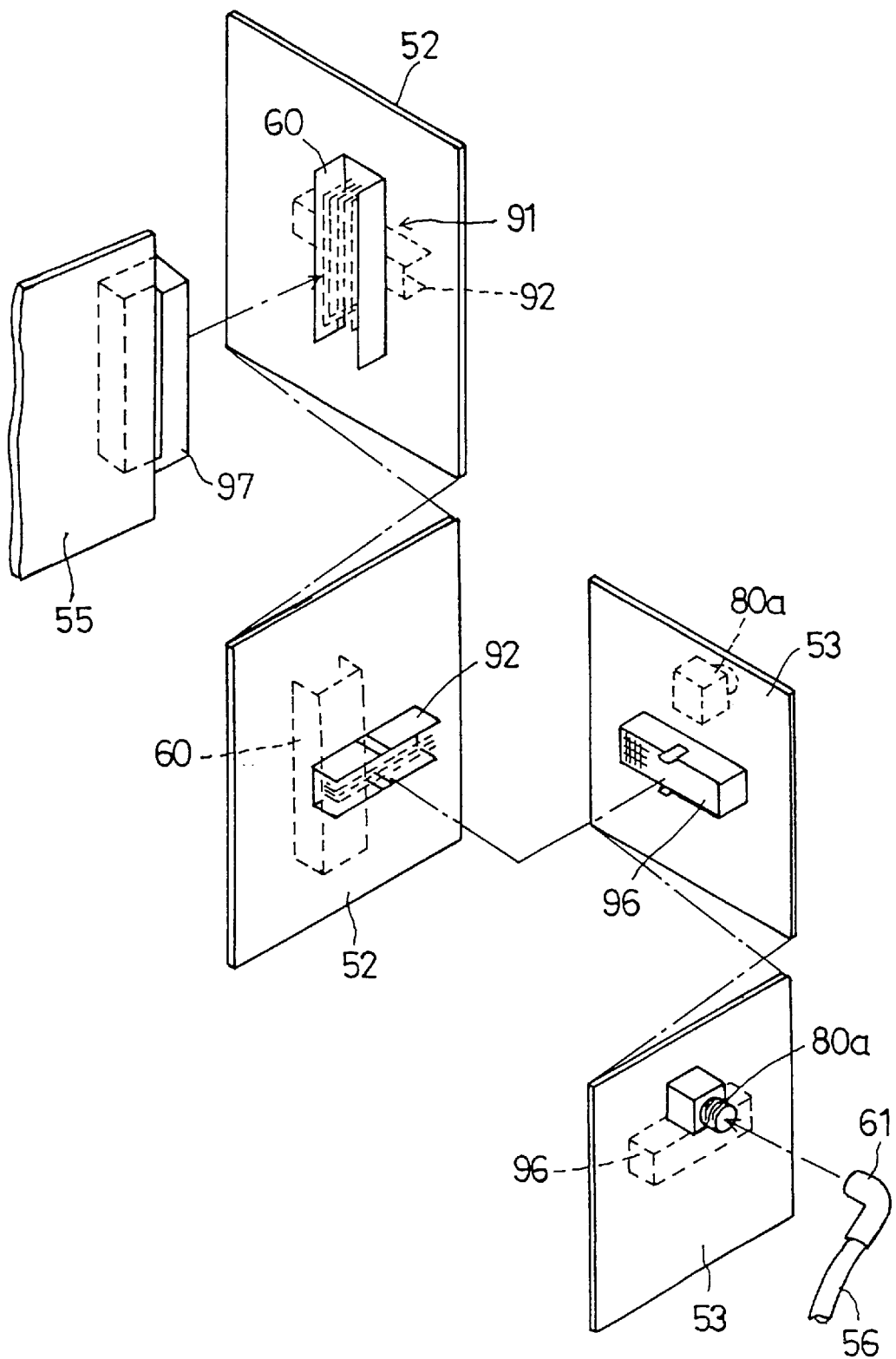
FIG. 14 is a diagram for explaining the electrical connection from the plug-in unit to the external cable.

On the main back wired board there is provided a connector device 19 as shown in FIG. 11 and FIG. 14. The relay connector device 91 comprises a plug-in unit connector 60 on the side toward the Y2 direction and a relay connector 92 on the side toward the Y1 direction, as shown in FIG. 10.

In order to create the connector device 91, a metric connector 93 like that shown in FIG. 11(A) is prepared. The metric connector 93 has a shroud 93a and a longer-than-usual pin terminal 93b that pierces the shroud 93a. The pin terminal 93b has a press-fit portion 93b1 at approximately a central position of the pin terminal 93b.

As shown in FIG. 11(B), the pin 93b of the metric connector 93 is inserted into and through an aperture 52a in the main back wired board 52 and the press-fit portion 93b1 is pressed into the aperture 52a so as to occupy the interior of the aperture 52a. As a result, the metric connector 93 is firmly fixedly mounted on the main back wired board.

As shown in FIG. 11(C), a sorting plate 94 is fitted to the pins of the pin terminal 93b that project horizontally from the surface of the main back wired board 52 so as to sort the pins of the pin terminal 93b into predetermined rows. In this state, as shown in FIG. 11(D), a shroud 95 is fitted to the pin terminal 93b and pressed against the pin terminal 93b. Since the pins of the pin terminal 93b have been sorted by the sorting plate 94, the shroud is securely fitted to the entire pin terminal 93b. The pins of the pin terminal 93b project into the interior of the shroud 95, the sorting plate 94 is advanced against the surface of the main back wired board 52, the holes 95a of the shroud 95 is pressed against an opposing finger-like projecting portion 94a projecting from the sorting plate 94, the projecting finger-like portion 94a clamps the pin terminal 93b, thus fixedly mounting the shroud 95.

A portion of the metric relay connector 93 that projects horizontally in the Y2 direction from the main back wired board 52 forms the plug-in unit connector 60.

The shroud 95 and the pin terminal 93b projecting into the interior of the shroud 95 forms the relay connector 92.

For the sake of convenience, in FIG. 11 the shroud 93a of the plug-in unit connector 60 and the shroud 95 of the relay connector 92 are shown oriented in the same direction. However, in actuality, as shown in FIG. 10, the plug-in unit connector 60 has the shroud in a vertical Z-axis position while that relay connector 92 has the shroud in a front-to-back X-axis position, that is, perpendicular to the horizontal Y axis position. The relay connector 92 has the shroud positioned along the X axis because it is matched with the relay connector 96 on the surface Of the rear Y1 side of the sub back wired board 53.

Figure 12:
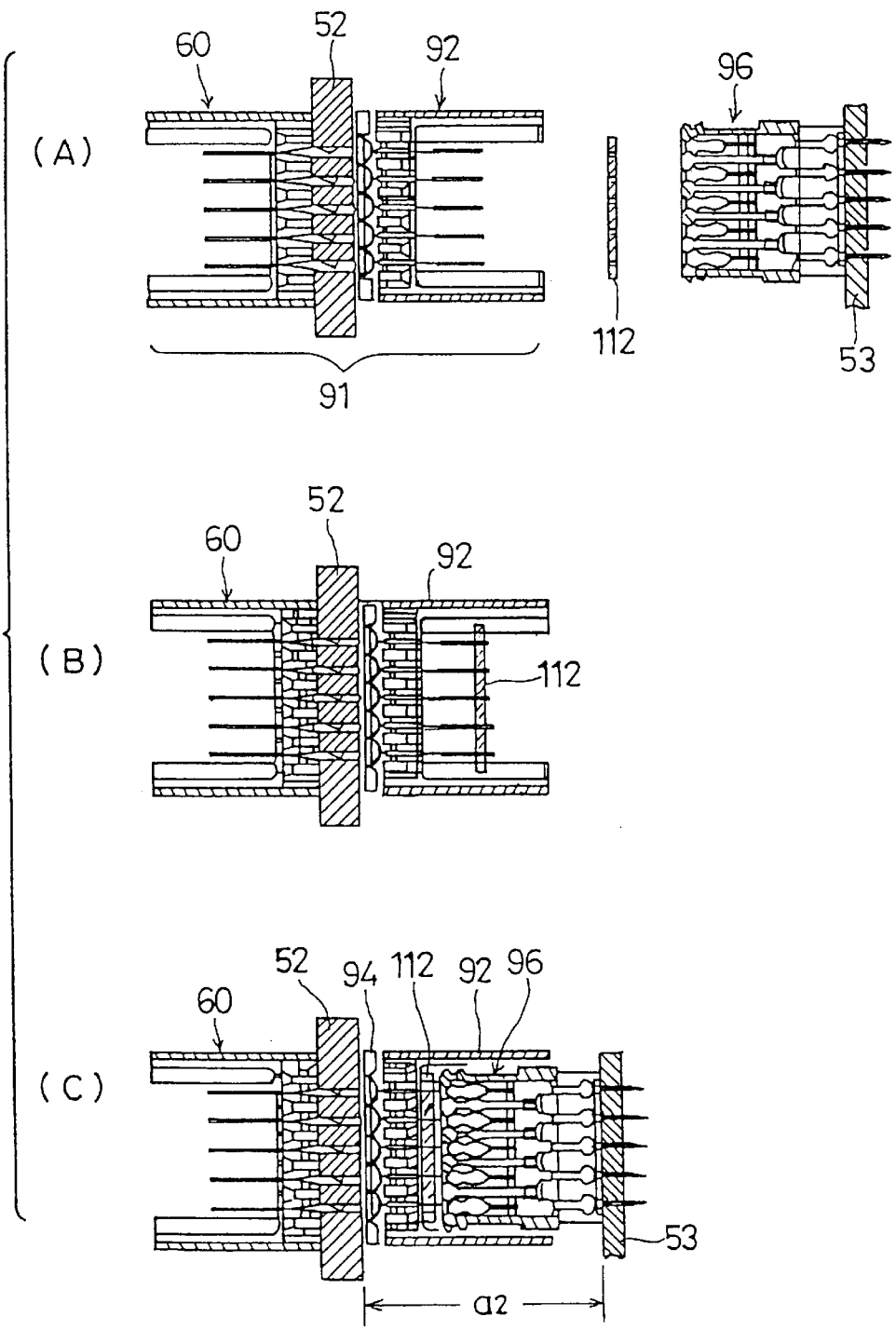
FIG. 12 is a diagram of the electrical connection between the main back wired board and the sub back wired board.

As shown in FIG. 10, FIGS. 12(A) and FIG. 14, an relay connector 96 is mounted on the surface of the Y1 side of the sub back wired board 53. The relay connector 96 opposes the previously mentioned relay connector 92 and is so disposed that a longer side thereof is positioned along the horizontal X axis in tandem with the DS3 interface connector group 80, with 8 connectors disposed each in two parallel upper and lower rows.

Each relay connector 96 is electrically connected to each connector 80a,81a and 82a via the wire pattern in the sub back wired board 53.

With the back wired board assembly 90, as shown in FIG. 12(C) all relay connectors 96 are fitted to and connected with corresponding relay connectors 92, thus the sub back wired board 53 and the main back wired board 52 are connected by connectors 96 and 92 and electrically connected. It should be noted that the materials and dimensions of the housing are such that each terminal has a predetermined impedance and, as a result, there is impedance matching between relay connectors 96 and relay connectors 92 at the fitted connection. It should also be noted that the fitted connection of relay connectors 96 and relay connectors 92 also has the effect of connecting the nub back wired board 53 and the main back wired board 52 mechanically as well as electrically.

A description will be given later of the connection of the connectors of the sub back wired board 53 with the main back wired board 52.

Figure 13:
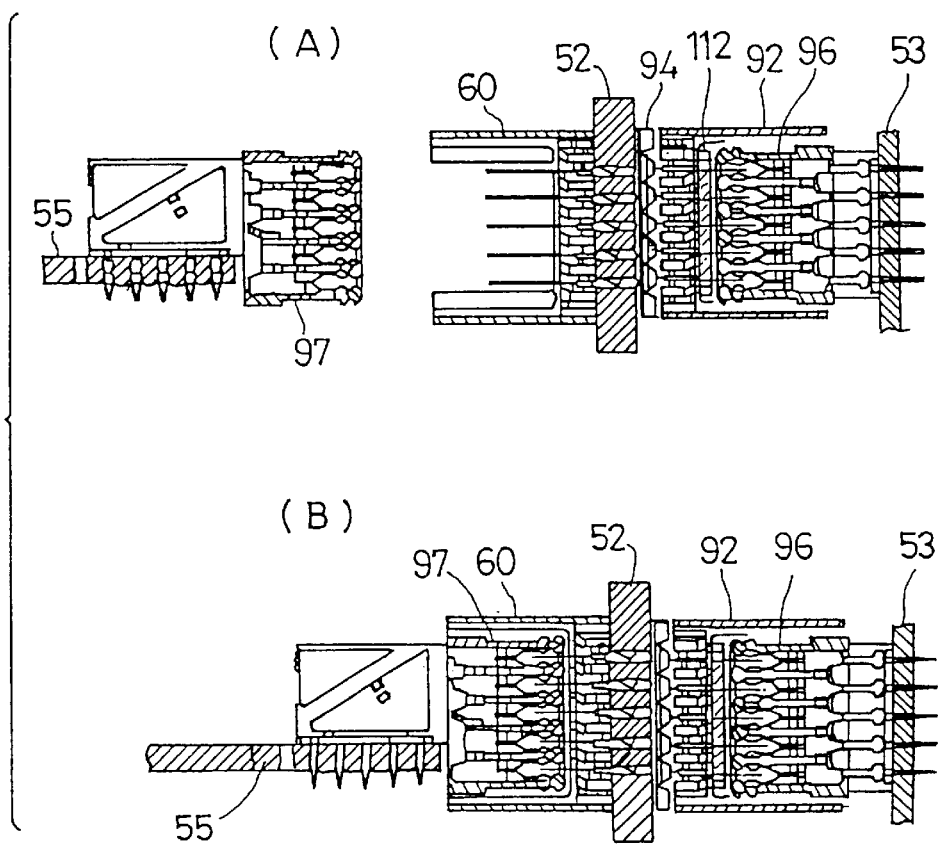
FIG. 13 is a diagram showing the connection of the plug-in unit to the back wired board.

The plug-in unit 55, as shown in FIG. 11(A) and (B) involves fitting the tip of the connector 97 in the direction of the insertion into the plug-in unit connector 60, connecting and then loading. The loaded plug-in unit 55 and the client interface external cable 56, as shown in FIG. 13(B) and FIG. 14, are electrically connected by the plug-in unit connector 60 being connected to the relay connector 92, which is connected to the relay connector 96, which is connected to the sub back wired board 53 which is connected to the connector 80a (81a, 82a).

Next, a description will be given of the assembly of the back wired key board assembly 90, that is, of the connection of the connectors of the sub back wired board 53 to the main back wired board 52.

Figure 16:
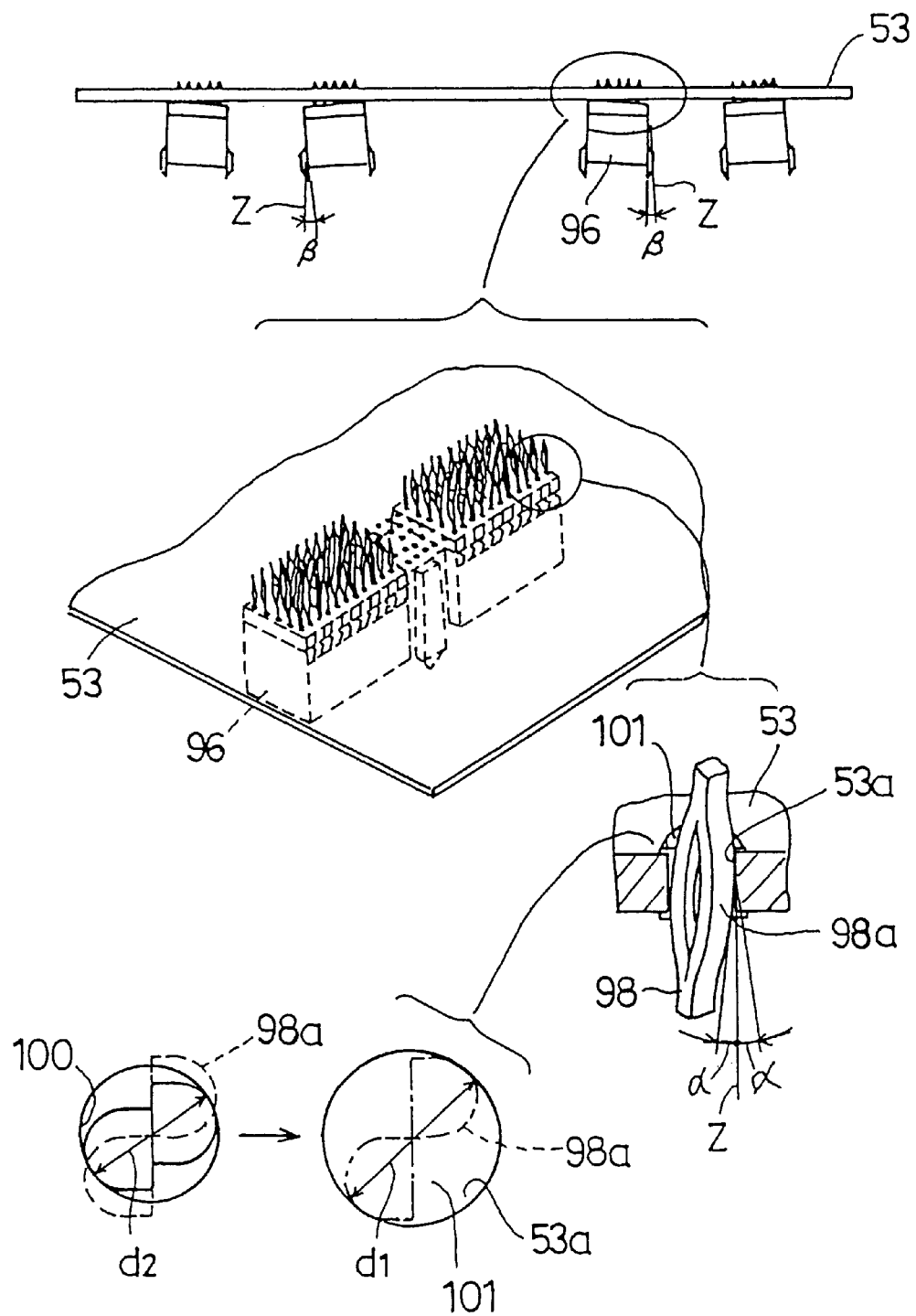
FIG. 16 is a diagram for explaining a provisional mounting of the relay connector to the sub back wired board.

As shown in FIG. 16, the relay connector 96 is provisionally affixed to the sub back wired board 53 The pin terminals 98 of the relay connector 96 have a press-fit portion 98a that is substantially a FIG. 8 in cross section. A through hole 53a for soldering is formed on the sub back wired board 53. A press-fit through hole 100 for press-fitting the press-fit portion 98a has a diameter d2 of 0.6 mm. The solder through hole 53a has a diameter dl of 0.85 mm, which is larger than the diameter of the press-fit through hole diameter d2 so as to accommodate the press-fit portion 98a without causing elastic deformation of the press-fit portion 98a.

The pin connector 98 of the relay connector 96 is inserted into the solder through hole 53a in the sub back wired board 53. The press-fit portion 98a is thus in a state of lightly contacting the inner surface of the solder through hole 53a, in such a way that the relay connector 96 does not come loose and fall out even when the sub back wired board 53 is positioned horizontally with the relay connector 96 facing downward. Moreover, adequate space 101 is left between the press-fit portion 98a and the solder through hole 53a so that the pin terminal 98 can be twisted laterally substantially within the solder through hole 53a at respective angles α (approximately 10 degrees) with respect to a hypothetical vertical line along the vertical Z axis.

Accordingly, the relay connector 96 is provisionally mounted on the sub back wired board 53 in a state in which it can be freely twisted within a range of angle β, that is, several degrees, with respect to a hypothetical vertical line along the vertical Z axis.

Figure 15:
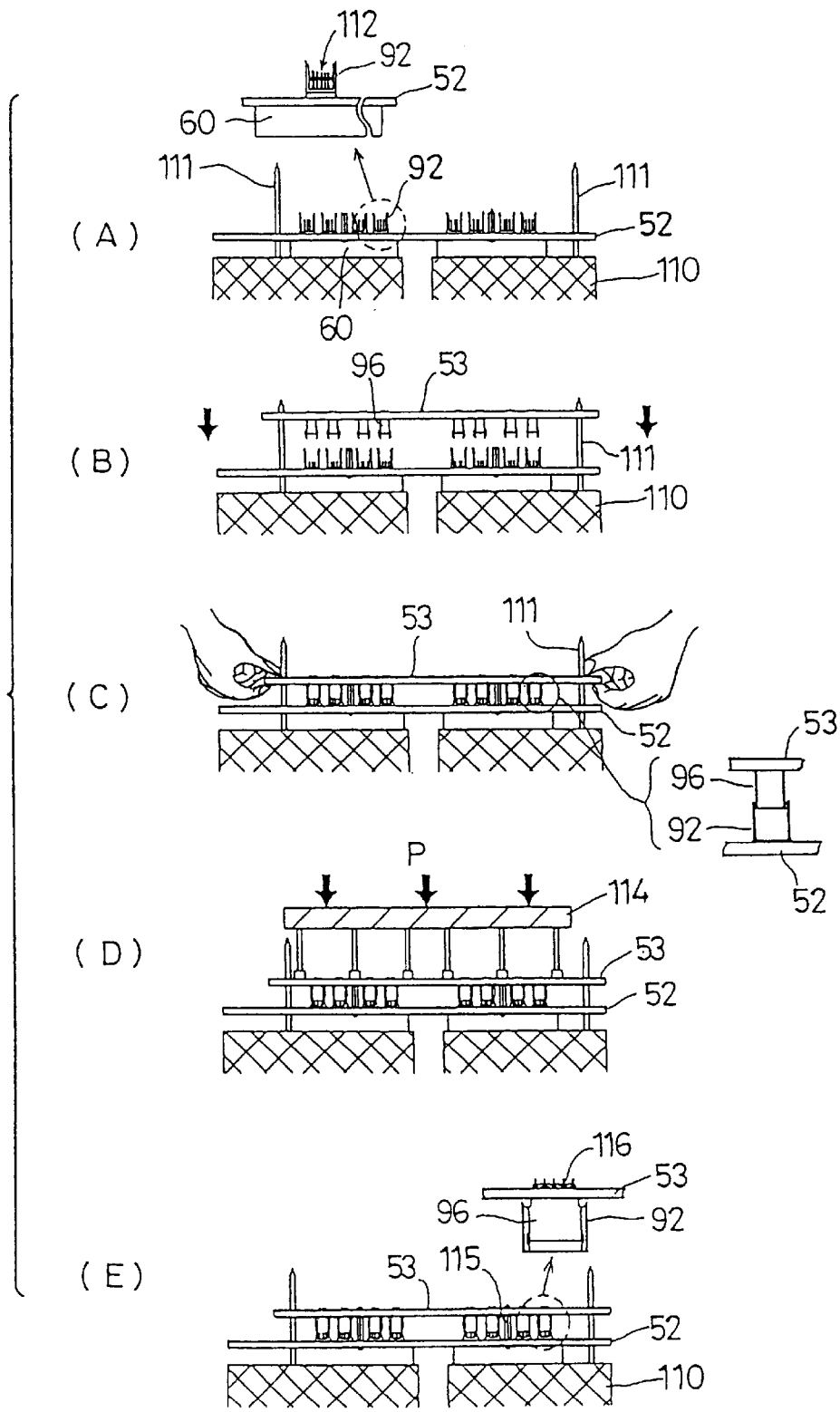
FIG. 15 is a diagram for explaining a method for assembling the back wired board assembly.

As shown in FIG. 15(A), assembly of the back wired board assembly 90 involves fitting guide holes on the main back wired board 52 to guide pins 111 and setting the main back wired board 52 onto a press jig 110.

Figure 17:
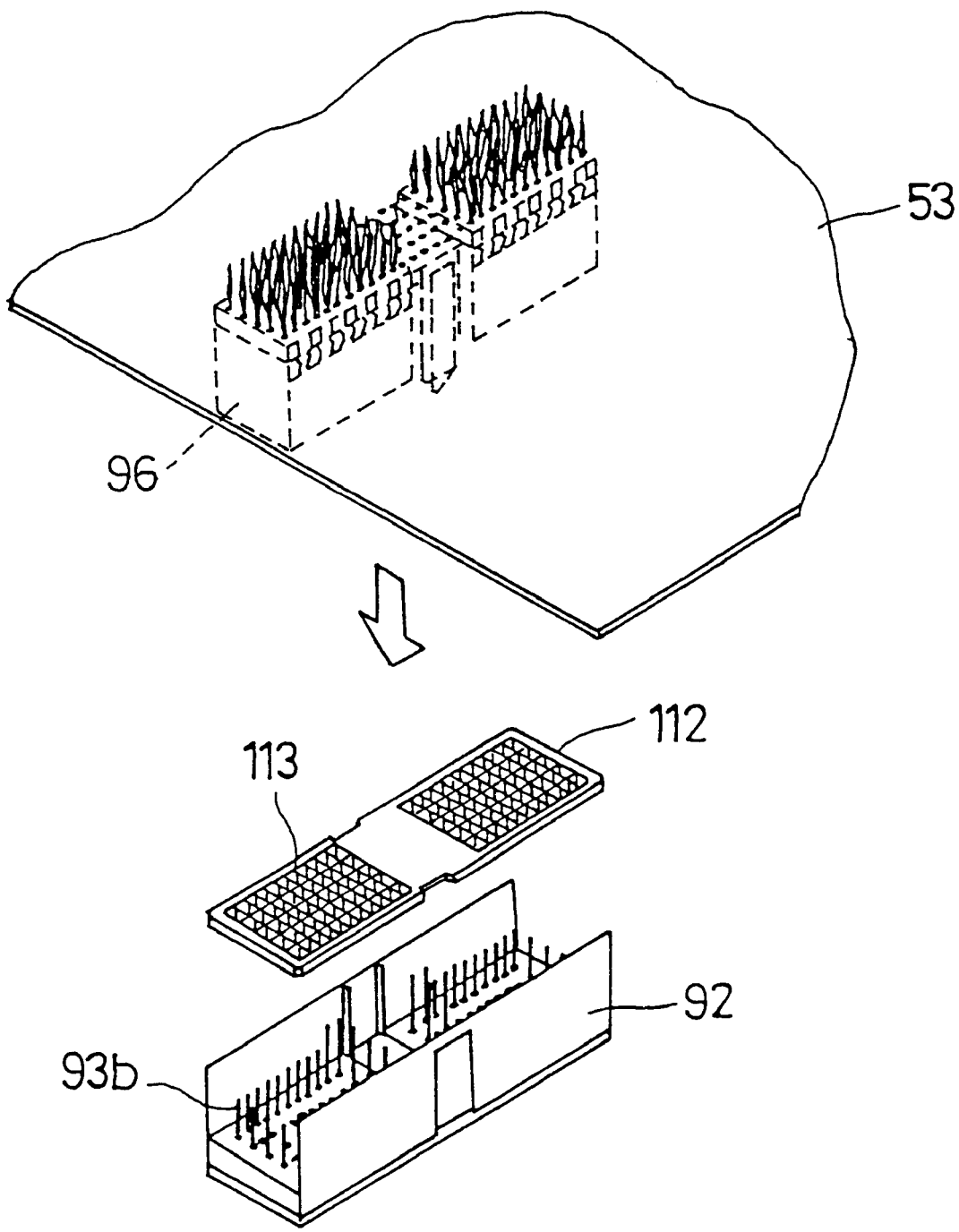
FIG. 17 is a diagram for explaining the interconnection of relay connectors on the back wired board.

Next, as shown in FIGS. 12(A) and (B) and FIG. 17, a sorting plate 112 is fitted lightly onto all the relay connectors 92. A plurality of holes 113 in the sorting plate 112 having tapered openings straightens the pins 93b of the relay connector 92 into perfect rows. By fitting the sorter plate 112 lightly onto the relay connector any bent pins are straightened and all the pins 93b are sorted into positions within ±0.05 mm of predetermined perfect rows.

Next, as shown in FIG. 15(B), an assembler holds the sub back wired board 53 provisionally mounting the relay connector 96 so that the relay connectors 96 face downward, fits the guide holes to the guide pins 111 and gently lowers the sub back wired board 53 onto the main back wired board 52 as shown in FIG. 15(C). All the relay connectors 96 are thus in a state of being fitted to the openings of the corresponding relay connectors 92.

Next, as shown in FIG. 15(D), the press jig 114 is set atop the sub back wired board 53, a press (not shown in the drawing) is set atop the press jig 114, a pressure P is applied to the press and all 24 of the relay connectors 96 are at once fitted to their corresponding relay connectors 92. The relay connectors 96 press upon the sorter plate 112 and are fitted to the relay connectors 92.

It should be noted that the depth of the fitting of the relay connectors 96 to the relay connectors 92 is reduced by an amount equal to the thickness of the sorter plate 112. However, the thickness of the sorter plate 112 is merely 1 mm, so the contacts 98b are fully connected to the pins 93b despite the presence of the sort plate 112.

With the relay connector 96 in a substantially loose state, each relay connector 96 is loosened appropriately so as to accommodate an opposite relay connector 92 and is fitted to a shroud 95. That is, any misalignment between corresponding relay connectors 96 and relay connectors 92 is absorbed and, accordingly, all 24 relay connectors 96 are together fitted normally to corresponding relay connectors 92. When the relay connector 96 is matched to the shroud, even relay connectors 96 that are badly misaligned with respect to their corresponding relay connectors 92 do not exert an excessive force on the shroud 95 and hence the shroud 95 does not crack.

Additionally, as described above the sorting plate 112 aligns all the pins 93*b* into predetermined perfect rows within a range of error of ±0.05 mm, and thus there is no danger of even one pin being bent and so failing to be connected. As a result, all of the approximately 1,800 pins 93*b* are inserted, with a relatively high degree of reliability, into the holes in the relay connector 96, and, accordingly, are normally and with a high degree of reliability connected to the contact 98*b* of the tips of the pin terminal 98.

By using the press jig 114 the sub back wired board 53 is maintained in substantially a true horizontal position and pressure is exerted on all 24 relay connectors 96 substantially evenly. By connecting the intermediate contacts 96 using the press jig 114 as described above, the reliability of the operation of connecting all 24 relay connectors 96 to relay connectors 92 is improved.

Next, screws are tightened atop spacing bolts 115 provided throughout the main back wired board 52, thus fixedly mounting the sub back wired board 53 to the main back wired board 52.

Next, the pin terminal 98 of the relay connector 96 is soldered to the solder through hole 53*a* of the sub back wired board 53. The soldering is shown as 116 in FIG. 15(E).

In the manner described above assembly of the back wired board assembly 90 is completed.

A description will now be given of a second and third example of the relay connector 96 mounted in a loose state of attachment to the sub back wired board 53.

Figure 18:
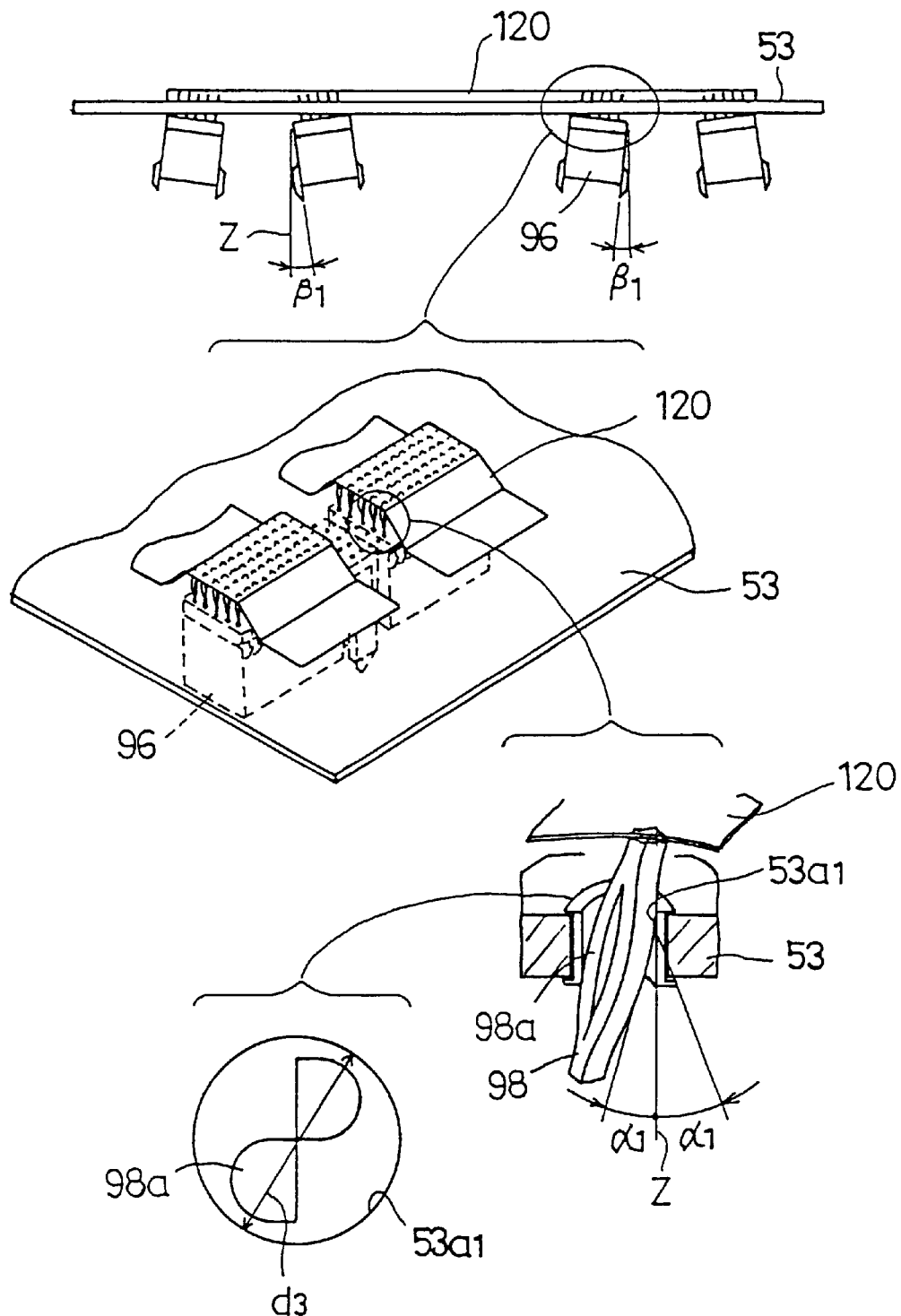
FIG. 18 is a diagram of a second example of a provisional mounting of a relay connector on the sub back wired board.

FIG. 18 shows a second example, in which the pin terminal 98 of the relay connector 96 is inserted into and through the solder through hole 53*a*1 in the sub back wired board 53 and the tip of the pin terminal 98 covered with an adhesive tape 120 and the tape attached to a top surface of the sub back wired board 53 so as to provisionally mount the pin terminal 98 to the sub back wired board 53 via the solder through hole 53*a*1. The provisional mounting of the pin terminal 98 is achieved by the use of adhesive tape 120, so the solder through hole 53*a*1 is slightly larger than the solder through hole 53*a* used for provisional mounting using friction as shown in FIG. 16, having a diameter of 1 mm. Accordingly, the pin terminal 98 can be twisted to the left and right around the vertical Z axis at an angle $\alpha 1$ of up to approximately 20 degrees, that is, greater than that described above. Accordingly, the relay connector 96 can be freely twisted around the vertical Z axis at an angle $\beta 1$ greater than that for the previous composition, that is, approximately 10 degrees, and thereby provisionally mounted on the sub back wired board 53.

Figure 19:
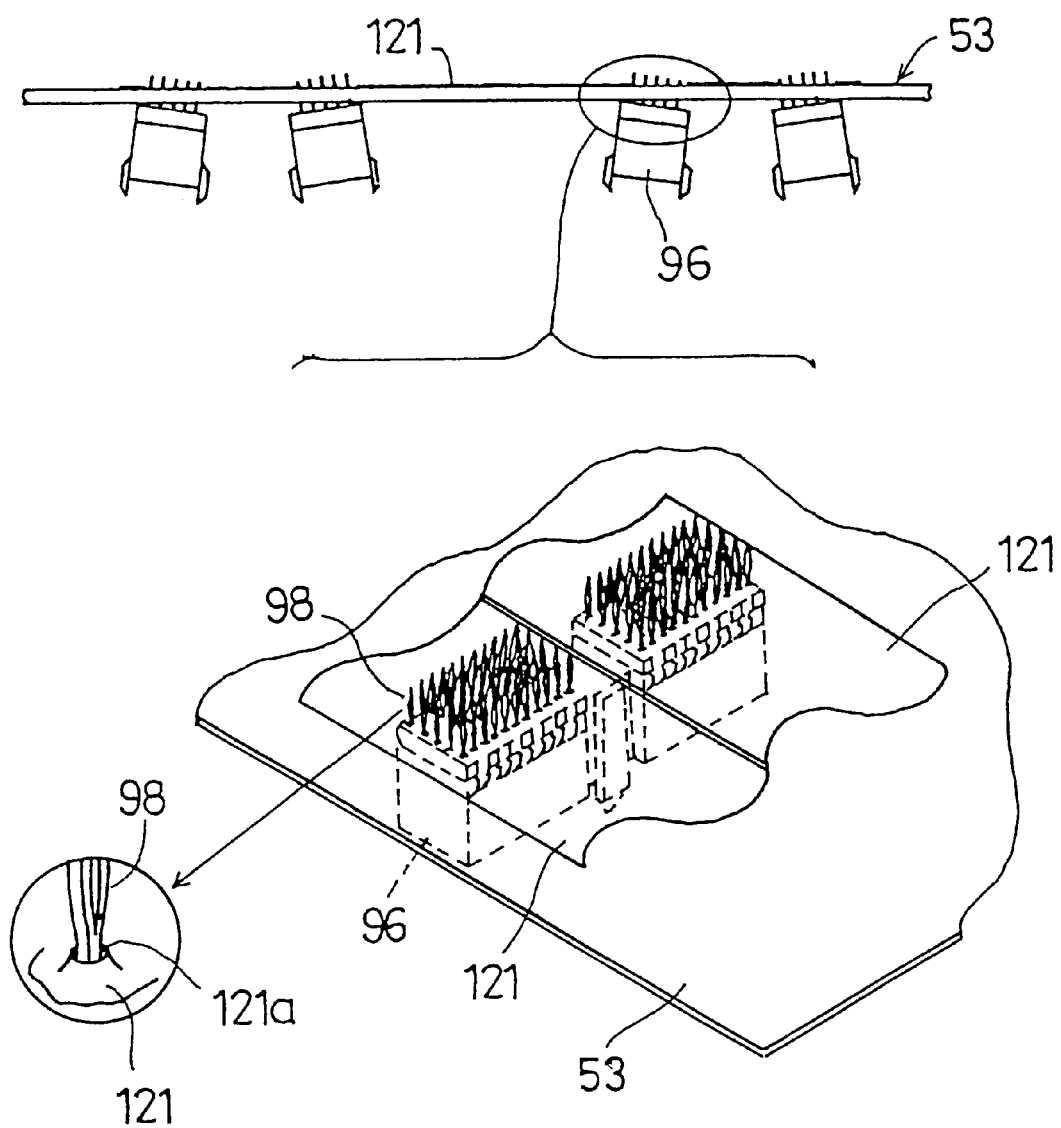
FIG. 19 is a diagram of a third example of a provisional mounting of a relay connector on the sub back wired board.

FIG. 19 shows a third example. In place of the adhesive tape 120 a sheet 121 having a plurality of holes 121*a* having an arrangement identical to the arrangement of the pin terminals 98 is used. Sheet 121 is fitted to the sub back wired board 53 in such a way that the plurality of holes 121*a* in the sheet 121 are fitted to the tips of the pin terminals 98 inserted into and through the solder through holes 53*a*1 of the Sub back wired board 53 and attached in such a way as to avoid easy loosening and detachment from the sub back wired board 53.

Next, a description will be given of a variation of the back wired board assembly, with particular reference to FIG. 20 and FIG. 21.

Figure 20:
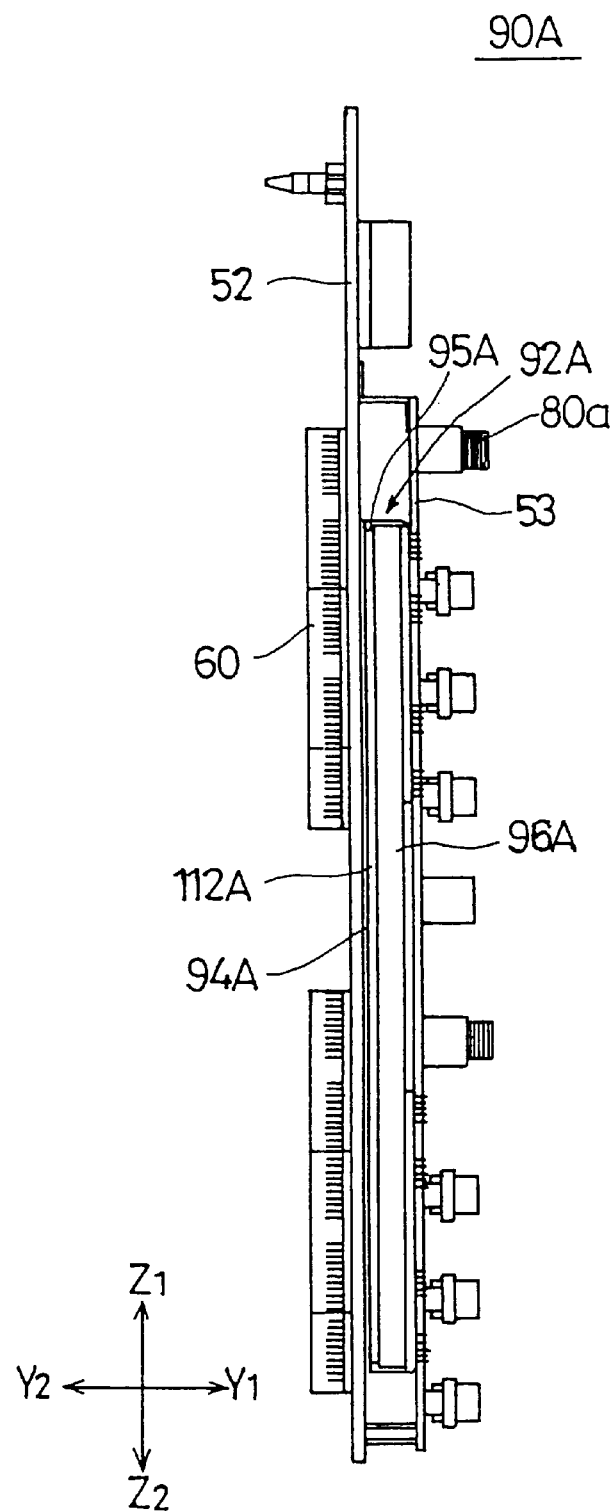
FIG. 20 is a diagram of a second example of a back wired board assembly.
Figure 21:
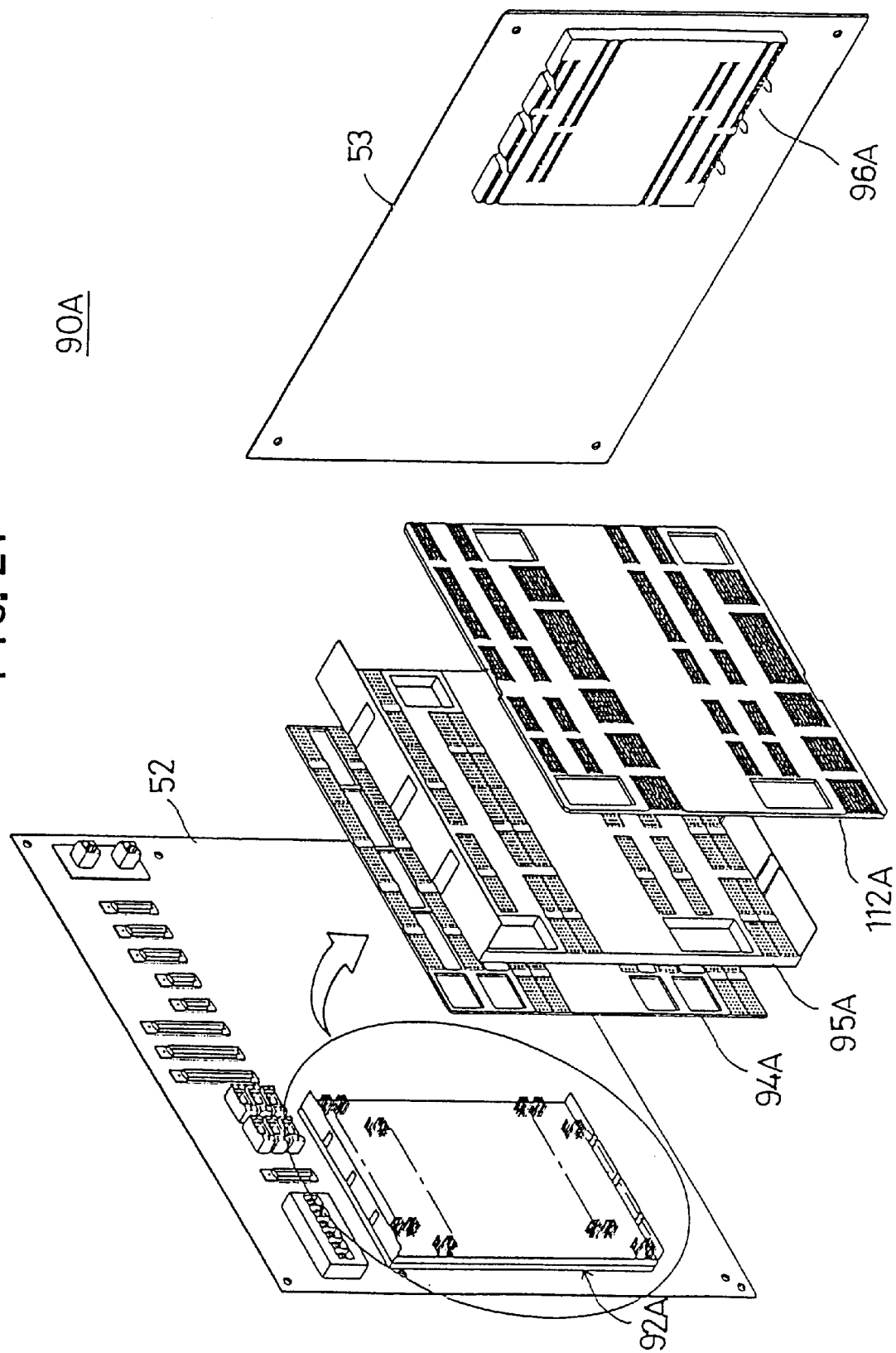
FIG. 21 is an oblique exploded view of the back wired board assembly depicted in FIG. 20.

FIG. 20 shows a second variation of a back wired board assembly 90A, which, as is shown in FIG. 21, provides on the main back wired board 52 an relay connector 92A having 24 individual connectors arranged as a single unit in one flat plane. Similarly, a similarly large relay connector 96A having 24 individual connectors arranged as a single unit in one flat plane is provided on the sub back wired board 53. Relay connector 92A and relay connector 96A are connected to each other.

Relay connector 92A comprises a large sorting plate 94A that itself combines 24 individual sorter plates 94 and a shroud 95A corresponding in size to the sorting plate 94A.

The relay connector 96A of the sub back wired board 53 is fitted to the relay connector 92A using a press to fit a large sorting plate 112A that itself combines 24 individual sorting plates 112 onto the tips of the pins 93*b* so as to straighten the pins 93*b*.

It should be noted that there is one relay connector 92A and one relay connector 96A. As a result, all the pins 93*b* of relay connector 92A correspond to all the holes in relay connector 96A, and thus relay connector 96A and relay connector 92A fit together smoothly.

Figure 23:
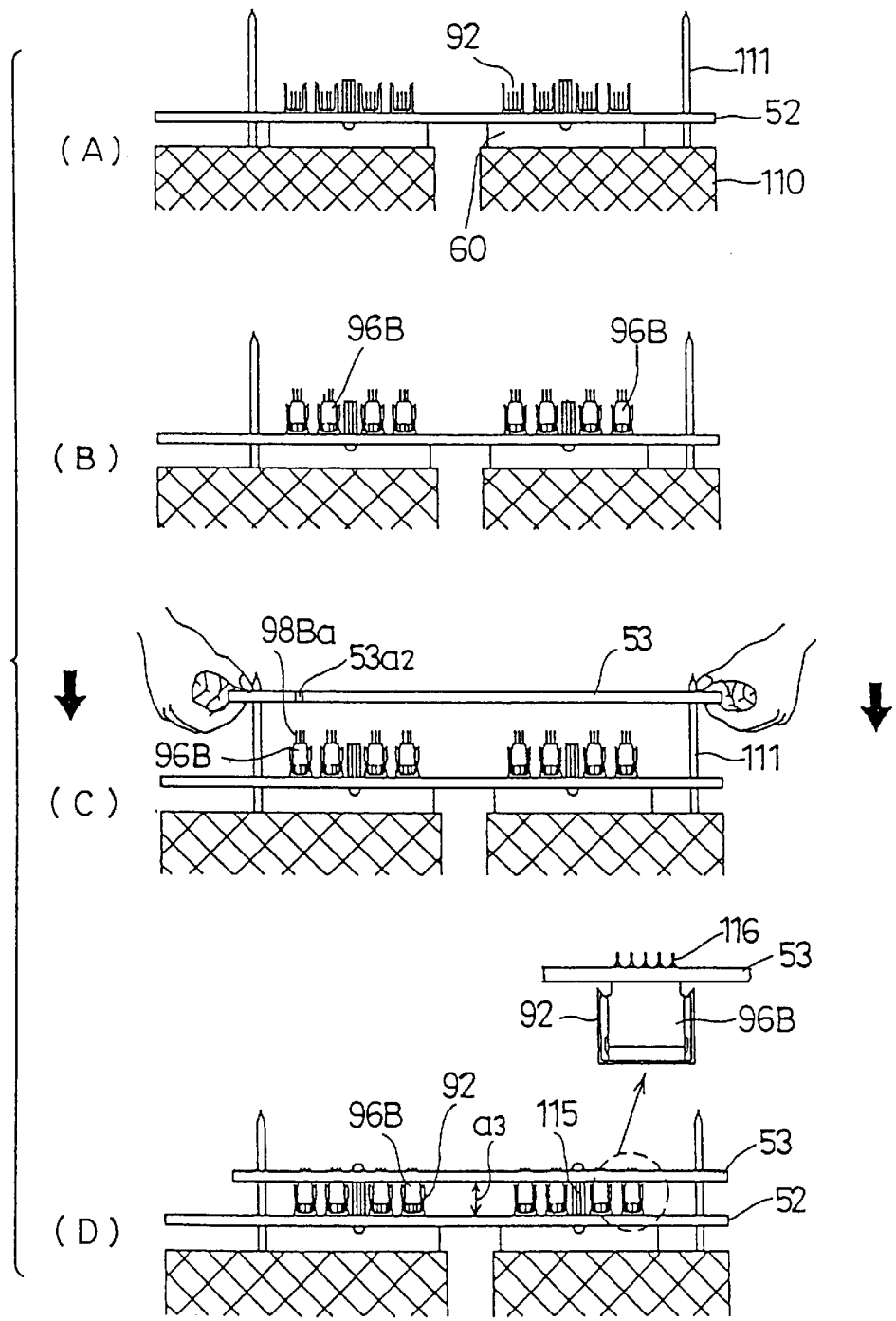
FIG. 23 is a diagram for explaining a method for assembling a third example of the back wired board assembly.
Figure 24:
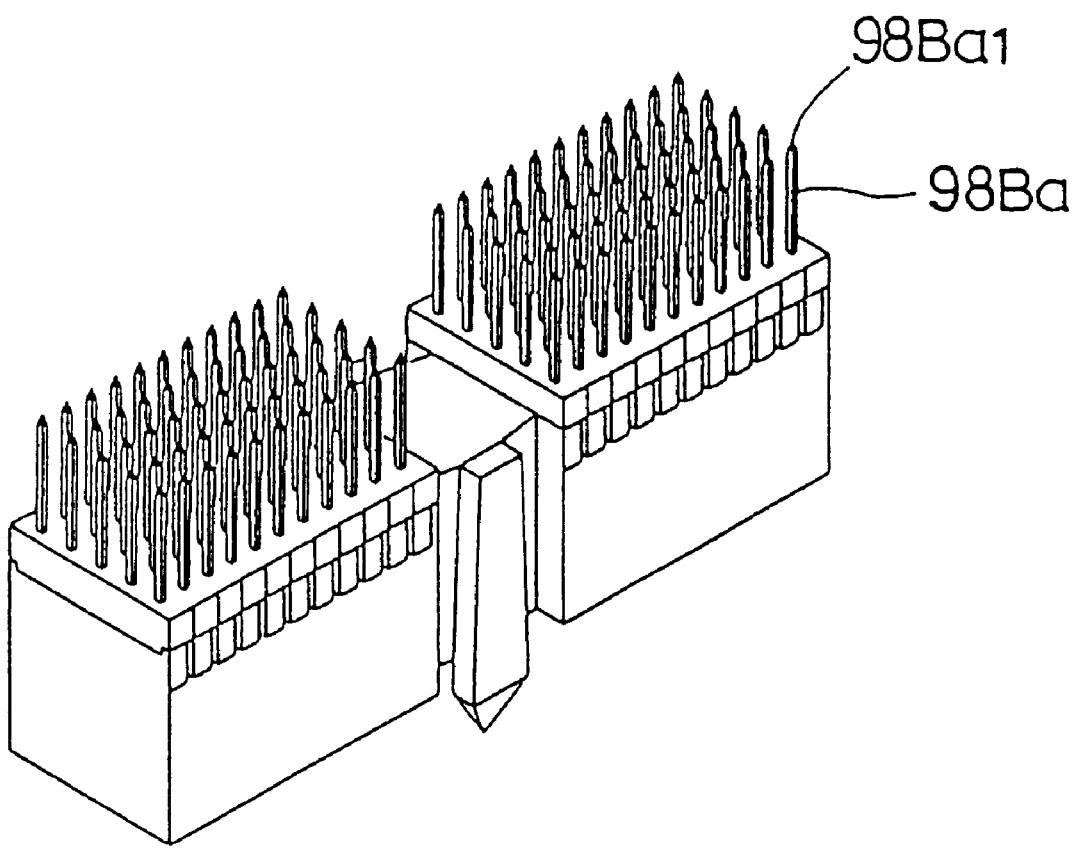
FIG. 24 is a diagram of the relay connector depicted in FIG. 23.

A description will now be given of a third example, with particular reference to FIG. 22, FIG. 23 and FIG. 24.

Figure 22:
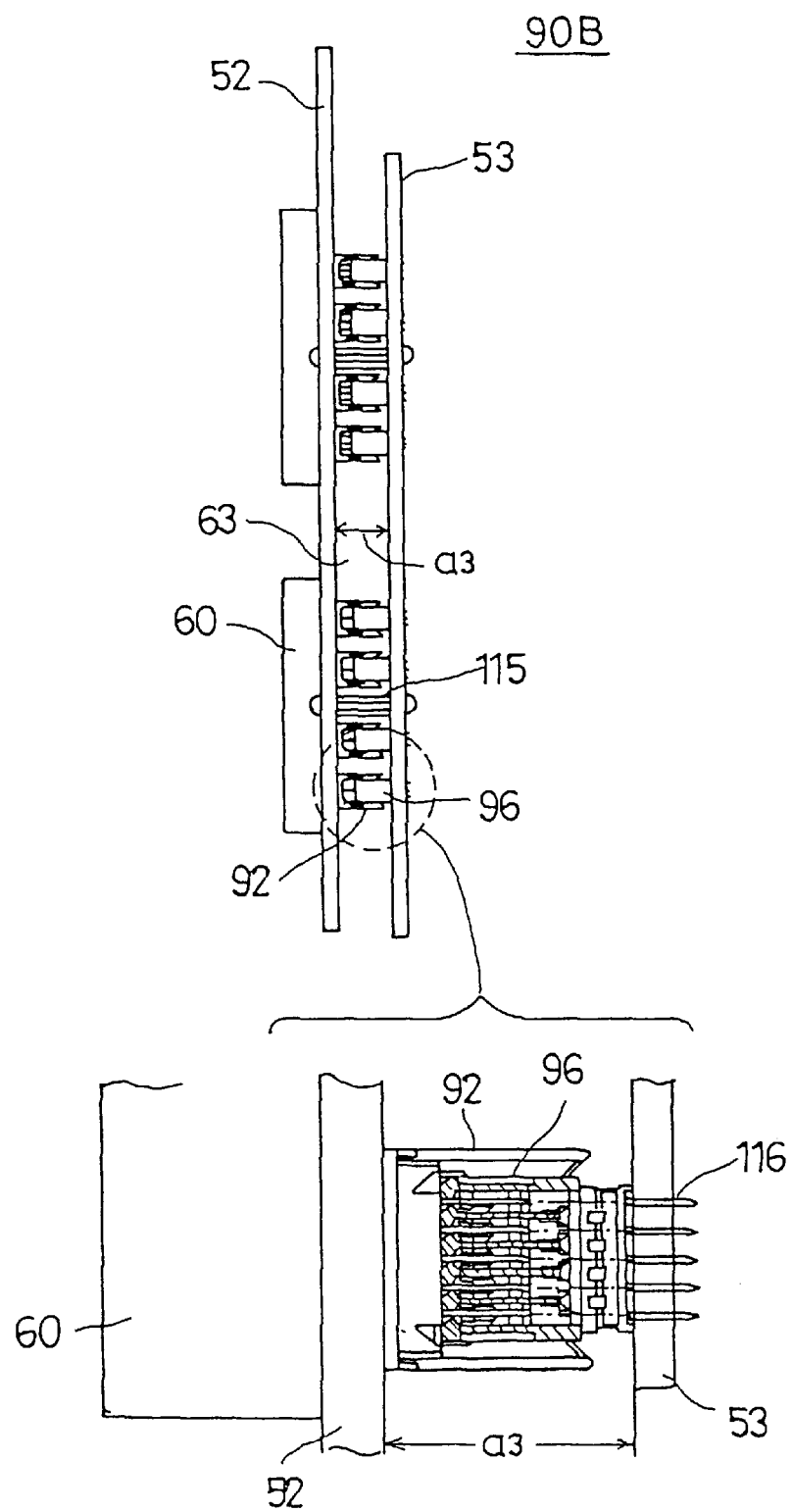
FIG. 22 is a diagram of a third example of a back wired board assembly.

FIG. 22 shows a third example of a back wired board assembly 90B. The back wired board assembly 90B comprises the main back wired board 52, the sub back wired board 53, relay connector 92 connected to relay connector 96B, and the whole fixedly mounted by screws tightened in spacing bolts 115. There is no sorter plate 112 like that shown in FIG. 12, so the interval a3 of space 63 between the sub back wired board 53 and the main back wired board 52 is approximately 16 mm, that is, approximately 1 mm less than that shown in the back wired board assembly 90 shown in FIG. 6 and FIG. 7. The lack of a sorter plate 112 arises from the method of assembly, which precludes the need for such sorter plate 112.

The back wired board assembly 90B, as shown in FIG. 23(A) comprises a main back wired board 52 that is connector device 90, the guide holes of which are fitted to the guide pins 111 and set on the press jig 110. Next, as shown in FIG. 23(B), the relay connectors 96B depicted in FIG. 24 are one by one fitted to relay connectors 92. No sorter plate is used, and the pin terminals 98B are positioned so as to face up.

Next, as shown in FIG. 23(C), the assembler holds the sub back wired board 53 in both hands, fits the guide holes to the guide pins 111, gently lowers the sub back wired board 53 so as to fit the solder through holes 53*a*2 to the corresponding pin terminals 98B. The solder through holes 53*a*2 have a large diameter and the pin terminals 98B have pointed tips 98B*a* so as to ease the fitting of the individual soldering through holes 53*a*2 to their corresponding pin terminals 98B.

Next, the screws are tightened to the spacing bolts 115 on the sub back wired board 53 and the pin terminals 98B of the relay connectors 96B are soldered to the soldering through holes 53*a*1 of the sub block wired board 53.

As can be readily appreciated from the above description, the back wired board assembly 90B can be assembled without the use of a press. Additionally, it should be noted that an relay connector 96 like that depicted in FIG. 12 may be used in place of the relay connector 96B.

A description will now be given of a fourth example of a back wired board assembly 90, with particular reference to FIG. 25 through FIG. 30.

Figure 27:
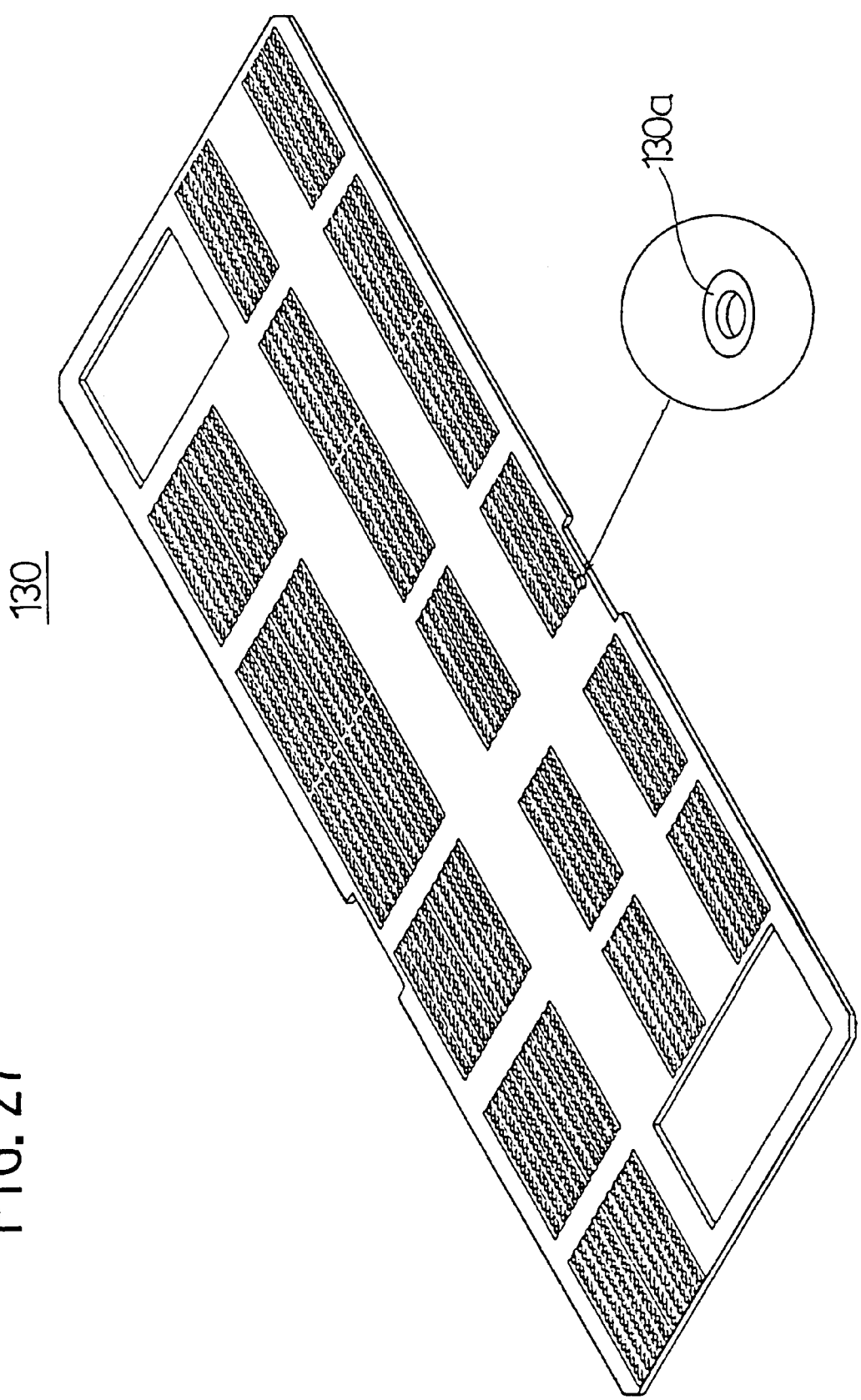
FIG. 27 is an oblique view of a spacer.
Figure 28:
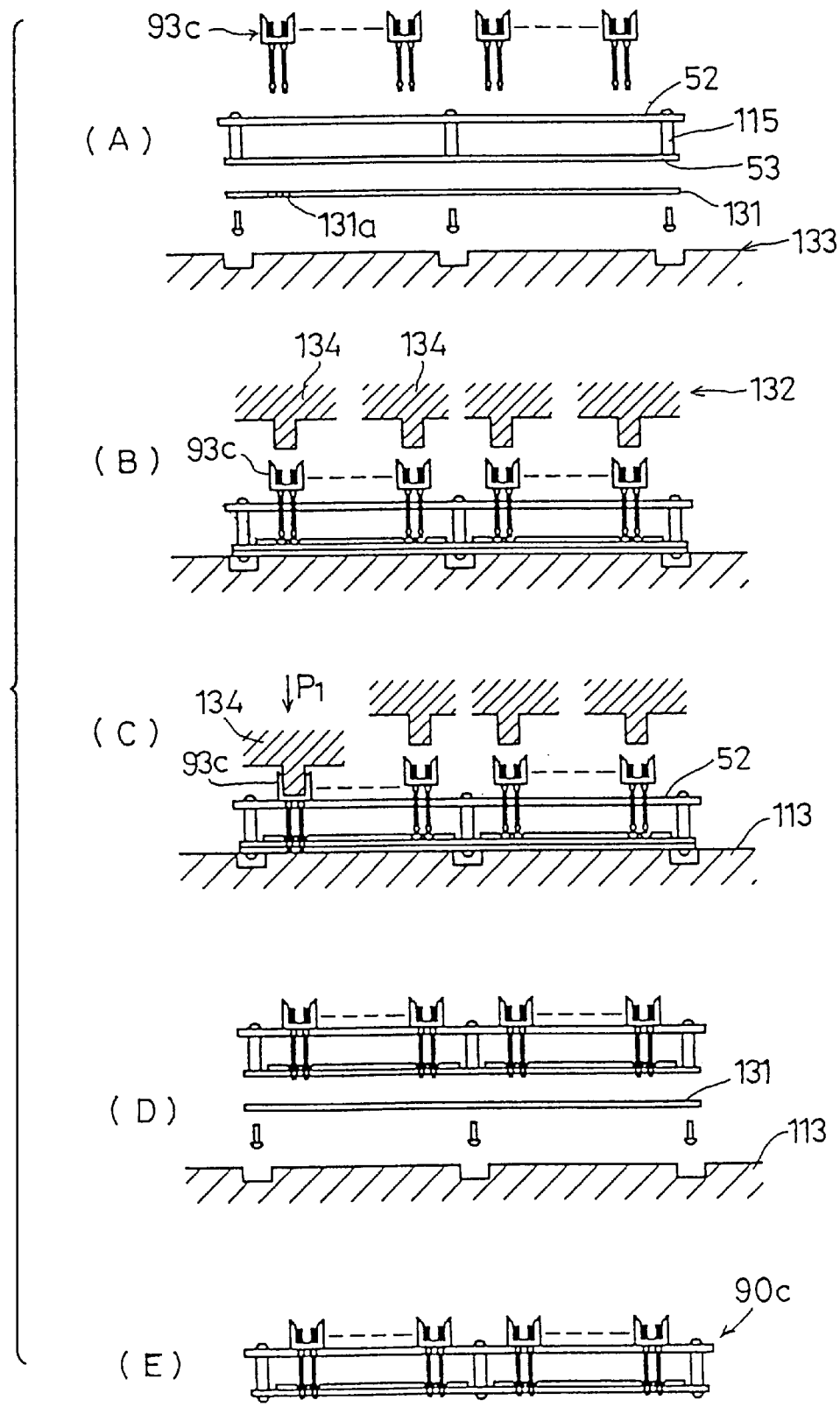
FIG. 28 is a diagram for explaining a method of assembling the back wired board assembly depicted in FIG. 25.
Figure 29:
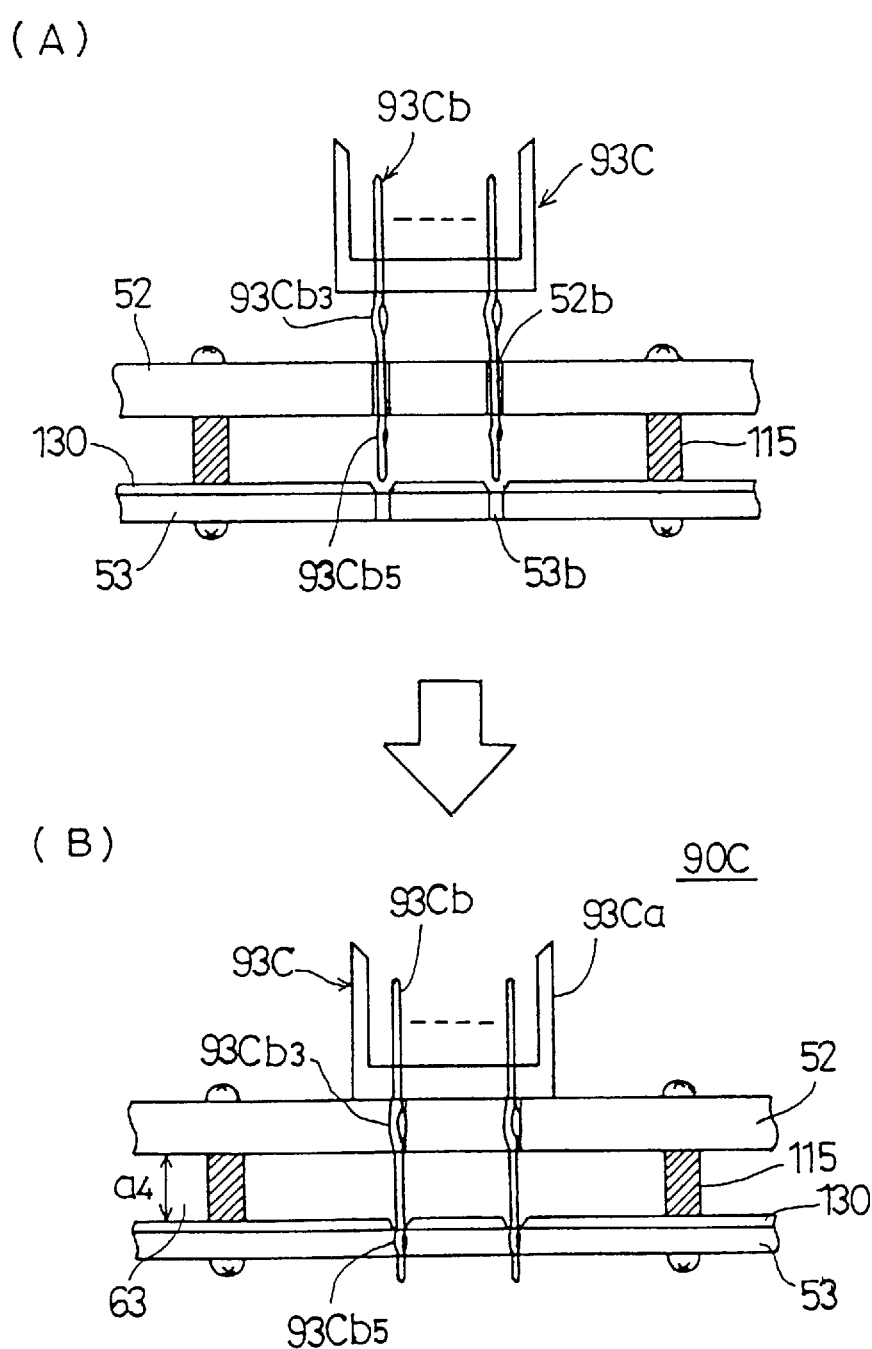
FIG. 29 is a diagram of parts of steps (B) and (C) of FIG. 28.

FIG. 25 shows a fourth example of a back wired board assembly 90C. The back wired board assembly 90C is assembled such that the main back wired board 52 and sub back wired board 53 are fixedly mounted in such a way that by use of spacing bolts 115 and screws the main back wired board 52 and sub back wired board 53 are spaced apart, being connected by the pin terminals 93c of the connector 93C, that is, the connector 60. An auxiliary spacer 130 like that shown in FIG. 27 is fixedly mounted on an upper surface of the sub back wired board 53. Unlike the back wired board assemblies 90, 90A and 90B depicted in FIG. 10, FIG. 20 and FIG. 22, this example has no relay connector 92 on the main back wired board side 52 and no relay connector 96 on the sub back wired board 53. As a result, the interval a4 of the space 63 between the main back wired board 52 and the sub back wired board 53 is 3–7 mm, that is, approximately 10 mm less than that in the back wired board assemblies 90, 90A and 90B shown in FIG. 10, FIG. 20 and FIG. 22. Accordingly, by the use of this back wired board assembly 90C, the A2 depth dimension shown in FIG. 4 can be decreased by 12 inches or more, thereby making it possible to achieve a shorter telecommunications device.

Figure 26:
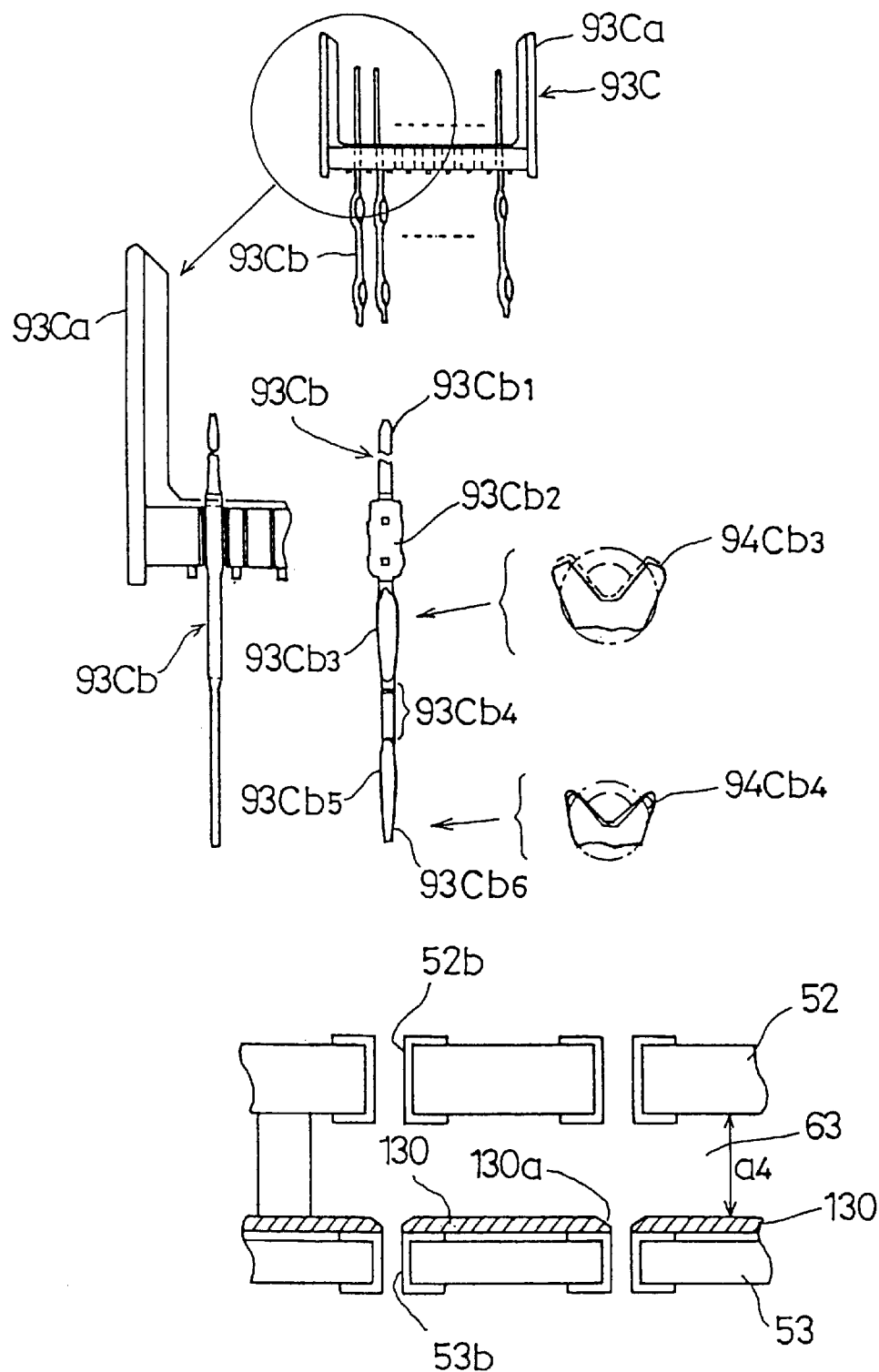
FIG. 26 is an expanded and exploded view of a portion of the back wired board assembly depicted in FIG. 25.

As shown in FIG. 26, connector 93C has a pin terminal 93C$b$ through which penetrates through a shroud 93C$a$. The pin terminal 93C$b$ is an action pin terminal having two press-fit portions and, from the top, is structured as follows: The pin terminal portion 93C$b1$, the insertion portion 93C$b2$ for inserting into the shroud 93C$a$, the first press-fit portion 93C$b3$, the pin portion 93C$b4$, the second press-fit portion 93C$b5$ and the tip portion 93C$b6$. The size of the second press-fit portion 93C$b5$ is slightly smaller than the size of the first press-fit portion 93C$b3$. The insertion portion 93C$b2$ of the pin terminal 93C$b$ is pressed into and fixedly mounted at the through hole of the shroud 93C$a$, such that the first press-fit portion 93C$b3$, the pin portion 93C$b4$, the second press-fit portion 93C$b5$ and the tip portion 93C$b6$ project from the bottom of the shroud 93C$a$.

The main back wired board 52 has a press-fit through hole 52$b$ having a diameter corresponding to the size of the first press-fit portion 93C$b3$ of the pin terminal 93C$b$. The sub back wired board 53 has a press-fit through hole 53$b$ having a diameter corresponding to the size of the second press-fit portion,93C$b5$. The diameter of the press-fit through hole 53$b$ of the sub back wired board 53 is slightly smaller than the diameter of the present invention fit through hole 52$b$ of the main back wired board.

The first press-fit portion 93C$b3$ is inserted into the press-fit through hole 52$b$ of the main back wired board 52. The second press-fit portion 93C$b5$ is inserted into the press-fit through hole 53$b$ of the sub back wired board 53. As a result, the pin portion 93C$b4$ cuts across space 63. The tip portion 93C$b6$ projects from the surface of the sub back wired board 53.

A description will now be given of the assembly of the back wired board assembly 90C described above, with initial reference to FIG. 28.

As shown in FIG. 28(A), the main back wired board 52 and the sub back wired board to which the supplementary spacer 130 is fixedly mounted, together with an auxiliary board 131 positioned beneath and contacting the bottom surface of the sub back wired board 53, are fixedly mounted at intervals using screws tightened to spacing bolts 115. This entire assemblage is then placed atop a press jig 132 and the connector 93C is set to the main back wired board 52 as shown in FIG. 28(B) and FIG. 29(A). The connector 93C is connected such that the second press-fit portion 93C$b5$ is inserted into and through the press-fit through hole 52$b$ provided on the main back wired board 52, and the second press-fit portion 93C$b3$ is inserted into the mouth of the press-fit through hole 52$b$.In this state, the tip portion 93C$b6$ opposes a tapered guide hole 130$a$ provided in the auxiliary spacer 130. In some cases, the tip portion 93C$b6$ is guided by the tapered portion of the tapered guide hole 130$a$ and inserted into the press-fit through hole 53$b$ of the sub back wired board 53. It should be noted that the auxiliary spacer 130 is provided in order to guide the tip portion 93C$b6$ into the press-fit through hole 53$b$ of the sub back wired board 53 using the tapered guide hole 130$a$.

A through hole 131$a$ having a diameter larger than the press-fit through hole 53$b$ to which it corresponds is formed in the auxiliary board 131, and is provided in order to receive the tip portion 93C$b6$ that is projected from the bottom surface of the sub back wired board 53.

The press 132 has rams 134 provided at positions corresponding to each of the individual connectors 93C. Each such ram 134 operates independently of the others. The press 132 is operated and the individual press rams 134 press down upon each of the connectors set atop the main back wired board 52 as shown in FIG. 28(C), achieving a state like that depicted in FIG. 29(B). The first press-fit portion 93C$b3$ is pressed into the press-fit through hole 52$b$ of the main back wired board 52. The second press-fit portion 93C$b5$ is inserted into the press-fit through hole 53$b$ of the sub back wired board 53. The shroud 93C$a$contacts the upper surface of the main back wired board 52. The tip portion 93C$b6$ is guided by the tapered guide h9ole 130$a$ into and through the press-fit through hole 53$b$ of the sub back wired board 53, and projects below the bottom surface of the sub back wired board 53 to within a thickness of the auxiliary board 131.

Each of the connectors 93C is pressed down individually, so even a small amount of pressure P1 exerted on the rams 134 is sufficient. Additionally, after all the connectors 93C have been pressed into place as shown in FIG. 28(D), the auxiliary board 131 is removed and the screws tightened once more, thereby producing the back wired board assembly 90C depicted in FIG. 28(E).

As can be readily appreciated from the above description, the back wired board assembly can be assembled efficiently and stablely.

FIG. 30 shows another method for assembling the back wired board assembly 90C, in which a device is used to press and insert one at a time each of the pin terminals 93C$b$ having two press-fit portions.

The initial preparatory stage is identical to that shown in FIG. 28(A). As shown in FIG. 30 (A), the main back wired board 52 and the sub back wired board 53 to which is fixedly mounted an auxiliary spacer 130, together with an auxiliary board 131 positioned beneath and contacting the sub back wired board 53, are spaced and fixedly mounted by screws tightened to spacing bolts 115. Next, this assemblage is set to the pin pressing device, a shroud 93C$a$ placed on the upper surface and the terminal pins 93C$b$, one at a time, from the top of the shroud 93C$a$, are passed through the shroud 93C$a$and the main back wired board 52 and pressed into the sub back wired board 53 as shown in FIG. 30(B) and (C), thus completing assembly of the back wired board assembly 90C as shown in FIG. 30(C).

It should be noted that the pin terminal 93C$b$ is inserted as independent parts and so even slight pressure is sufficient to ensure insertion of the pin terminal 93C$b$, thus eliminating the need to brace the sub back wired board 53 with a brace plate or other, similar means.

A fifth example of a back wired board assembly will now be described, with reference to FIG. 31.

Figure 31:
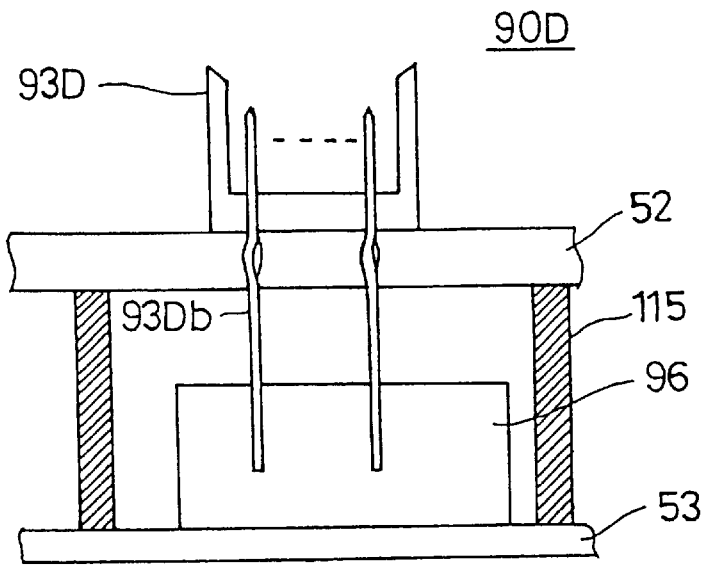
FIG. 31 is a diagram of a fifth example of a back wired board assembly.

FIG. 31 shows a fifth example of the back wired board assembly 90D. The main back wired board 52 and the sub back wired board 53 are fixedly mounted at an interval via screws tightened through spacing bolts 115. The top surface of the main back wired board 52 fixedly mounts a connector 93D (connector 60). The tip portions of the pin terminals 93Db of the connector 93D are connected to relay connector 96 on the top surface of the sub back wired board 53. The main back wired board 52 and the sub back wired board 53 are electrically connected by the pin terminal 93Db of the connector 93D and the relay connector 96.

Figure 32:
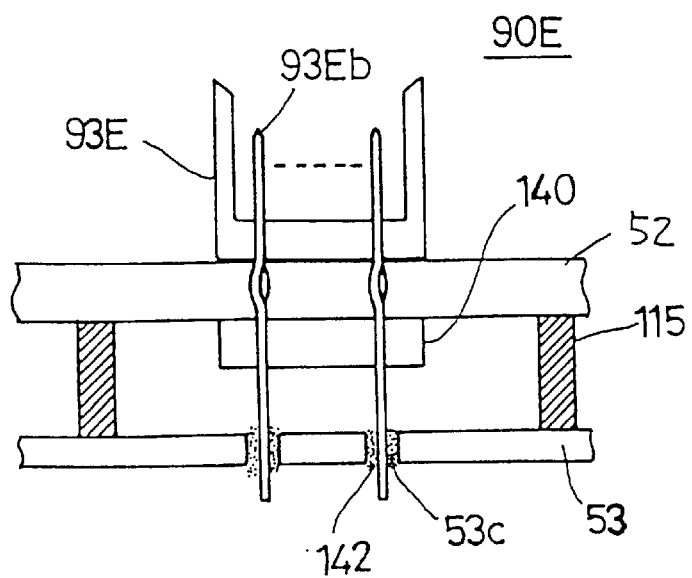
FIG. 32 is a diagram of a sixth example of a back wired board assembly.

FIG. 32 shows a sixth example of the back wired board assembly 90D. The main back wired board 52 and the sub back wired board 53 are fixedly mounted at an interval via screws tightened through spacing bolts 115. A connector 93E is fixedly mounted on the top surface of the main back wired board 52. The pin terminal 93E*b* of the connector 93E is straightened by a sorting plate 140 on the bottom surface of the main back wired board 52. The tip portion of the pin terminal 93E*b* is inserted into and through the through hole 53*c* provided in the sub back wired board 53 and connected by an electrically conductive adhesive agent 142. It should be noted that solder may be used in place of the electrically conductive adhesive agent 142.

The above description is provided in order to enable any person skilled in the art to make and use the invention and sets forth the best mode contemplated by the inventors of carrying out their invention.

The present invention is not limited to the specifically disclosed embodiments and variations, and modifications may be made without departing from the scope of the present invention.

The present application is based on Japanese priority application No. 10-304394 filed on Oct. 26, 1998, the entire contents of which are hereby incorporated by reference.

What is claimed is:

1. A shelf-type telecommunications device into which a plurality of plug-in units can be inserted side by side, the device comprising:

a shelf unit;

a main back wired board fixedly mounted to a back of the shelf unit;

a sub back wired board positioned further to the rear of the main back wired board;

a plurality of connectors for plug-in units mounted on an inner surface of the main back wired board so as to be connected to plug-in units;

a plurality of connectors for external cables mounted on an outer side of the sub back wired board so as to be connected to external cables;

a plurality of relay connectors mounted on a surface of the main back wired board, the surface opposing the sub back wired board, the plurality of relay connectors being distinct from and electrically connected to the plurality of connectors for plug-in units, and a plurality of relay connectors mounted on a surface of the sub back wired board, the surface opposing the main back wired board, the plurality of relay connectors being distinct from and electrically connected to the plurality of connectors for external cables, wherein the plurality of relay connectors on the main back wired board and the corresponding plurality of relay connectors on the sub back wired board are fitted together, and the main back wired board and the sub back wired board are electrically connected to each other.

2. The telecommunications device as claimed in claim 1, wherein the main back wired board and the sub back wired board form a single back wired board assembly, the plurality of relay connectors on the main back wired board and the plurality of relay connectors on the sub back wired board being fitted together and electrically connected.

3. The telecommunications device as claimed in claim 2, wherein the back wired board assembly is assembled so that a plurality of relay connectors on the sub back wired board are initially provisionally mounted in a loose state on the sub back wired board, and the relay connectors loosely mounted on the sub back wired board are simultaneously fitted to the corresponding plurality of relay connectors on the main back wired board.

4. The telecommunications device as claimed in claim 2, wherein the back wired board assembly is assembled so that plurality of relay connectors on the sub back wired board are initially provisionally mounted in a loose state on the sub back wired board, a plurality of pin terminals of a plurality of relay connectors are arranged on the main back wired board, a sorting plate straightens the pin terminals, and the relay connectors on the sub back wired board are fitted to corresponding relay connectors on the main back wired board so as to depress the sorting plate.

5. The telecommunications device as claimed in claim 3, wherein the provisional mounting in a loose state of the plurality of relay connectors on the sub back wired board is accomplished by loosely fitting a plurality of terminals of the plurality of relay connectors to a plurality of holes in the sub back wired board.

6. The telecommunications device as claimed in claim 3, wherein the provisional mounting in a loose state of the plurality of relay connectors on the sub back wired board is accomplished by loosely fitting the plurality of terminals of the plurality of relay connectors to and through a plurality of holes in the sub back wired board and holding the terminals in place by attaching tape to the tips of the terminals.

7. The telecommunications device as claimed in claim 2, wherein the back wired board assembly is assembled so that a plurality of sub back wired board relay connectors not mounted on the sub back wired board are fitted to and connected to each of the plurality of relay connectors on the main back wired board, the sub back wired board is guided by a plurality of guide pins and brought into proximity with pin terminals protruding from back surfaces of the plurality of sub back wired board relay connectors, and a plurality of through holes in the sub back wired board and the pin terminals are fitted together.

* * * * *